US012568859B2

(12) United States Patent
Jang et al.

(10) Patent No.: US 12,568,859 B2
(45) Date of Patent: Mar. 3, 2026

(54) SILICON CARBIDE BASED INTEGRATED PASSIVE DEVICES FOR IMPEDENCE MATCHING OF RADIO FREQUENCY POWER DEVICES AND PROCESS OF IMPLEMENTING THE SAME

(71) Applicant: MACOM Technology Solutions Holdings, Inc., Lowell, MA (US)

(72) Inventors: Haedong Jang, San Jose, CA (US); Marvin Marbell, Cary, NC (US); Jeremy Fisher, Raleigh, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 832 days.

(21) Appl. No.: 17/849,353

(22) Filed: Jun. 24, 2022

(65) Prior Publication Data
US 2023/0420439 A1 Dec. 28, 2023

(51) Int. Cl.
 *H03F 3/195* (2006.01)
 *H01L 25/065* (2023.01)
 (Continued)

(52) U.S. Cl.
 CPC .......... *H01L 25/18* (2013.01); *H01L 25/0655* (2013.01); *H03F 1/565* (2013.01); *H03F 3/195* (2013.01); *H10D 86/85* (2025.01); *H01L 24/32* (2013.01); *H01L 24/45* (2013.01); *H01L 24/48* (2013.01); *H01L 24/73* (2013.01); *H01L 2224/32225* (2013.01); *H01L 2224/32245* (2013.01); *H01L 2224/45124* (2013.01); *H01L 2224/45139* (2013.01); *H01L 2224/45144* (2013.01); *H01L 2224/45147* (2013.01); *H01L 2224/48137* (2013.01); *H01L 2224/48225* (2013.01); *H01L 2224/48245*

(2013.01); *H01L 2224/73265* (2013.01); *H01L 2924/10272* (2013.01); *H01L 2924/1033* (2013.01);
(Continued)

(58) Field of Classification Search
 CPC ..... H01L 25/18; H01L 25/0655; H01L 24/32; H01L 24/45; H01L 24/48; H01L 24/73; H01L 2224/32225; H01L 2224/32245; H01L 2224/45124; H01L 2224/45139; H01L 2224/45144; H01L 2224/45147; H01L 2224/48137; H01L 2224/48225; H01L 2224/48245; H01L 2224/73265; H01L 2924/10272; H01L 2924/1033; H01L 2223/6672; H01L 23/66; H01L 2223/6655; H03F 1/565; H03F 3/195; H03F 2200/222; H03F 2200/387; H03F 2200/451; H10D 86/85; H10D 1/20; H10D 1/68
 See application file for complete search history.

(56) References Cited

U.S. PATENT DOCUMENTS

| | | | |
|---|---|---|---|
| 2016/0087588 A1* | 3/2016 | Szymanowski | H03F 1/0288 330/307 |
| 2018/0175802 A1* | 6/2018 | Wu | H10D 84/811 |
| 2021/0313285 A1* | 10/2021 | Noori | H01L 23/49861 |

* cited by examiner

*Primary Examiner* — Elias Ullah
(74) *Attorney, Agent, or Firm* — BakerHostetler

(57) ABSTRACT

An amplifier circuit that includes an RF amplifier; an impedance matching network; a higher order harmonic termination circuit; a fundamental frequency matching circuit; and an integrated passive device (IPD) that includes a silicon carbide (SiC) substrate. The integrated passive device (IPD) includes one or more reactive components of the fundamental frequency matching circuit and one or more reactive components of the higher order harmonic termination circuit.

26 Claims, 31 Drawing Sheets

(51) Int. Cl.

| | |
|---|---|
| *H01L 25/18* | (2023.01) |
| *H03F 1/56* | (2006.01) |
| *H10D 86/85* | (2025.01) |
| *H01L 23/00* | (2006.01) |

(52) U.S. Cl.
CPC .. *H03F 2200/222* (2013.01); *H03F 2200/387* (2013.01); *H03F 2200/451* (2013.01)

freq (3.500GHz to 8.500GHz)

freq (3.500GHz to 8.500GHz)

SILICON CARBIDE BASED INTEGRATED PASSIVE DEVICES FOR IMPEDENCE MATCHING OF RADIO FREQUENCY POWER DEVICES AND PROCESS OF IMPLEMENTING THE SAME

FIELD OF THE DISCLOSURE

The disclosure relates to silicon carbide based integrated passive devices for impedance matching of radio frequency power devices. The disclosure further relates to a process of implementing silicon carbide based integrated passive devices for impedance matching of radio frequency power devices.

BACKGROUND OF THE DISCLOSURE

Typical radio frequency (RF) power devices have internal input and output pre-match for the matching convenience on printed circuit boards (PCB) boards. One example of the typical RF power devices is shown in FIG. 21. The input is a low-pass type matching circuit and the output is a high-pass type matching circuit for the fundamental impedance. On the output, a second harmonic short $L_{2f0}$ and $C_{2f0}$ resonator are connected in parallel with a fundamental shunt inductor $(L_{f0})$ match connected through a DC blocking capacitor $C_{f0}$.

Typically, the inductors are implemented using bonding wires. Accordingly, the fundamental shunt wires $(L_{f0})$, the second harmonic shunt wires $(L_{2f0})$, and the series drain wires $(L_3)$ are bonded to the transistor die drain pad, sharing the limited bonding pad space. This construction limits the allowed number of drain series wires $(L_3)$ which, then, limits the minimum achievable series inductance $L_3$.

Moreover, some typical implementations of matching circuits are implemented with devices having losses that impact device efficiency. Further, some typical implementations of matching circuits are implemented with devices generating heat. These typical implementations have poor thermal conductivity and accordingly the heat impacts device performance.

Accordingly, what is needed are devices for impedance matching that reduce an amount of bonding pad space utilized, reduce losses, increase efficiency, improve thermal performance, and/or the like.

SUMMARY OF THE DISCLOSURE

One aspect includes an amplifier circuit that includes an RF amplifier; an impedance matching network; a fundamental frequency matching circuit; a higher order harmonic termination circuit; and an integrated passive device (IPD) includes a silicon carbide (SiC) substrate, where the integrated passive device (IPD) includes one or more reactive components of the fundamental frequency matching circuit and one or more reactive components of the higher order harmonic termination circuit.

One aspect includes a process of implementing an amplifier circuit that includes implementing an RF amplifier; implementing an impedance matching network; implementing fundamental frequency matching circuit; implementing a higher order harmonic termination circuit; and configuring an integrated passive device (IPD) with a silicon carbide (SiC) substrate, where the integrated passive device (IPD) includes one or more reactive components of the fundamental frequency matching circuit and one or more reactive components of the higher order harmonic termination circuit.

One aspect includes an integrated circuit that includes an integrated passive device (IPD) includes a silicon carbide (SiC) substrate, where the integrated passive device (IPD) includes one or more reactive components of a fundamental frequency matching circuit and one or more reactive components of a higher order harmonic termination circuit.

One aspect includes an amplifier circuit that includes an RF amplifier includes a first terminal, a second terminal, and a reference potential terminal, the RF amplifier configured to amplify an RF signal across an RF frequency range that includes a fundamental RF frequency; an impedance matching network includes: a series branch connected in series between a first port of the amplifier circuit and the first terminal of the RF amplifier; a parallel branch connected in parallel with the first terminal and the reference potential terminal of the RF amplifier, the parallel branch includes a fundamental frequency matching circuit; a higher order harmonic termination circuit electrically connected in series with the fundamental frequency matching circuit; and an integrated passive device (IPD) includes a silicon carbide (SiC) substrate, where the integrated passive device (IPD) includes one or more reactive components of the fundamental frequency matching circuit and one or more reactive components of the higher order harmonic termination circuit.

One aspect includes a process of implementing an amplifier circuit that includes configuring an RF amplifier with a first terminal, a second terminal, and a reference potential terminal, the RF amplifier configured to amplify an RF signal across an RF frequency range that includes a fundamental RF frequency; configuring an impedance matching network with: a series branch connected in series between a first port of the amplifier circuit and the first terminal of the RF amplifier; connecting a parallel branch in parallel with the first terminal and the reference potential terminal of the RF amplifier, the parallel branch includes a fundamental frequency matching circuit; connecting a higher order harmonic termination circuit electrically in series with the fundamental frequency matching circuit; and configuring an integrated passive device (IPD) with a silicon carbide (SiC) substrate, where the integrated passive device (IPD) includes one or more reactive components of the fundamental frequency matching circuit and one or more reactive components of the higher order harmonic termination circuit.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 20H and FIG. 20I provide simulation results of the circuit according to FIG. 20G.

DETAILED DESCRIPTION OF THE DISCLOSURE

Figure 1:
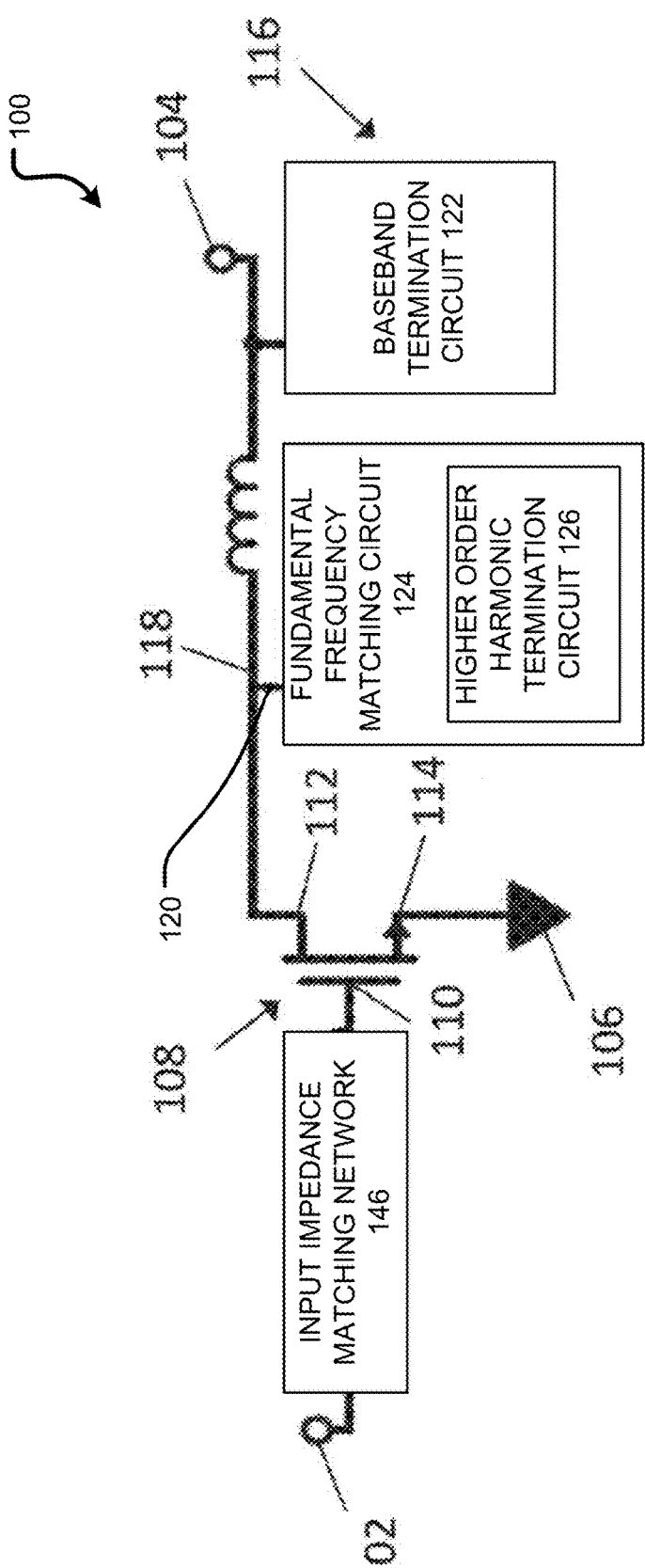
FIG. 1 illustrates an electrical schematic of an amplifier circuit according to an aspect of the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different aspects disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Radiofrequency (RF) power amplifiers are used in a variety of applications such as base stations for wireless communication systems and/or the like. The RF power amplifiers are designed to provide linear operation without distortion. The signals amplified by the RF power amplifiers often include signals that have a high frequency modulated carrier having frequencies in a 400 megahertz (MHz) to 4 gigahertz (GHz) range as well as others. The baseband signal that modulates the carrier is typically at a relatively lower frequency and, depending on the application, can be up to 300 MHz or higher.

The RF power amplifiers can include a transistor die to amplify the RF signal. Examples of transistor dies that are used in RF applications include MOSFETs (metal-oxide semiconductor field-effect transistor), LDMOS (laterally-diffused metal-oxide semiconductor) devices, HEMT (high electron mobility transistor) devices, and/or the like. These devices typically have relatively low characteristic impedances, such as 2 ohms or less.

Input and output impedance matching networks are used to match the relatively low characteristic impedances of RF transistors for high power devices, to a fixed impedance value, such as 50 ohms. In this way, greater efficiency is obtained by load matching. However, the input and output impedance matching networks are frequency selective and introduce impedance dispersion versus frequency, which results in band limited power amplifier operations. Thus, an important goal of RF amplifier design of is highly efficient operation over a wide bandwidth.

Efficient amplifier operation can be achieved by properly terminating RF signals in the baseband frequency that is below the fundamental frequency and by properly terminating higher order harmonics of a fundamental signal that are above the fundamental frequency range. One way to filter these signals out is to provide tuning circuits at the circuit board level, for example, outside of the package that includes the RF transistor die. However, circuit board level termination techniques are complex and require the use of valuable space. Moreover, these techniques have limited effectiveness due to parasitic effects that influence a propagation of the signals between the transistor die and the circuit board.

Another way to filter these signals out is at the package level. For example, within the same package that includes the RF transistor die. While this solution advantageously places the tuning circuitry close to the transistor die, the solution adds complexity to the design. Moreover, more exact tuning is difficult to achieve due to mutual coupling effects between the bond wires connecting to the various components of the tuning network. This issue becomes particularly problematic as the complexity and component count of the tuning network increases.

Typical RF power devices have low-pass input, high-pass output internal matches. In this regard, the disclosure implements the output high-pass DC blocking cap with baseband termination that may be integrated as an IPD. The second harmonic frequency can also be terminated by a series LC resonator connected in parallel with the fundamental shunt. In this disclosure, a shunt resonator may be connected in series with the high-pass inductor. The inductor can be implemented using the low-loss SiC IPD.

FIG. 1 illustrates an electrical schematic of an amplifier circuit according to an aspect of the disclosure.

The aspects of FIG. 1 may include any other aspects of the disclosure. Referring to FIG. 1, an amplifier circuit 100 is depicted and the amplifier circuit 100 may include an input port 102, an output port 104, and a reference potential port 106. The amplifier circuit 100 additionally may include an RF amplifier device 108 having an input terminal 110 electrically coupled to the input port 102, an output terminal 112 electrically coupled to the output port 104, and a reference potential terminal 114 electrically coupled to the reference potential port 106.

The amplifier circuit 100 may further include an output impedance matching network 116 that may be electrically coupled between the output terminal 112 and the output port 104. The output impedance matching network 116 may include a baseband termination circuit 122, a fundamental frequency matching circuit 124, and a higher order harmonic termination circuit 126. The amplifier circuit 100 additionally may include an input impedance matching network 146 connected between the input port 102 of the amplifier circuit 100 and the input terminal 110 of the RF amplifier device 108.

The output impedance matching network 116 may include a series branch 118 that is connected in series between the output terminal 112 of the RF amplifier device 108 and the output port 104 of the RF amplifier device 108 and a parallel branch 120 that is in parallel with output port 104 of the RF amplifier and the reference potential terminal 114. The parallel branch 120 may connect to the fundamental frequency matching circuit 124 and/or the higher order harmonic termination circuit 126

In various aspects, the RF amplifier device 108 and a complete implementation of the amplifier circuit 100 can be a multi-carrier amplifier, a multiband amplifier, an LTE (long term evolution) compliant amplifier, a WCDMA (wideband code division multiple access) compliant amplifier, an 802.11(x) compliant amplifier, and/or the like Generally speaking, the RF amplifier device 108 can be any device that can perform amplification for an RF signal. In the depicted aspect, the RF amplifier device 108 is a transistor device, wherein the input terminal 110 corresponds to a control terminal or gate terminal of the transistor device, the output terminal 112 corresponds to a first load terminal (e.g., the drain terminal) of the transistor device, and the reference potential terminal 114 corresponds to a second load terminal (e.g., the source terminal) of the transistor device.

The RF amplifier device 108 is configured to amplify an RF signal across an RF frequency range as between the input terminal 110 and output terminals, 112 across an RF frequency range that includes a fundamental RF frequency. According to an aspect, this frequency range is a so-called "wideband" frequency range. A "wideband" frequency range refers to the fact that the range of frequency values for the RF signal exceeds the coherence bandwidth of a single channel.

In the following exemplary discussion, an RF frequency range between 1.8 GHz (gigahertz) and 2.2 GHz with a fundamental (center) frequency of 2.0 GHz is used for exemplary purposes in describing the parameters of the amplifier circuit 100. In this example, the second order harmonics of the fundamental RF frequency lie in the range of 3.6 GHz to 5.4 GHz, with the second order harmonic of the fundamental frequency being at 4.0 GHz. Moreover, in this example, a baseband signal that modulates the RF signal in the RF frequency range lies in a baseband frequency range that is substantially lower than the RF frequency range, e.g., in a range of 400 MHz (megahertz) in the case of a fundamental frequency range of 1.8 GHz-2.2 GHz. More generally, the principles described herein can be applied to a wide variety of different frequency ranges, including fundamental frequencies in the range of 100 MHz to 10 GHz and baseband frequencies in the range of several MHz to 500 MHz.

Figure 2:
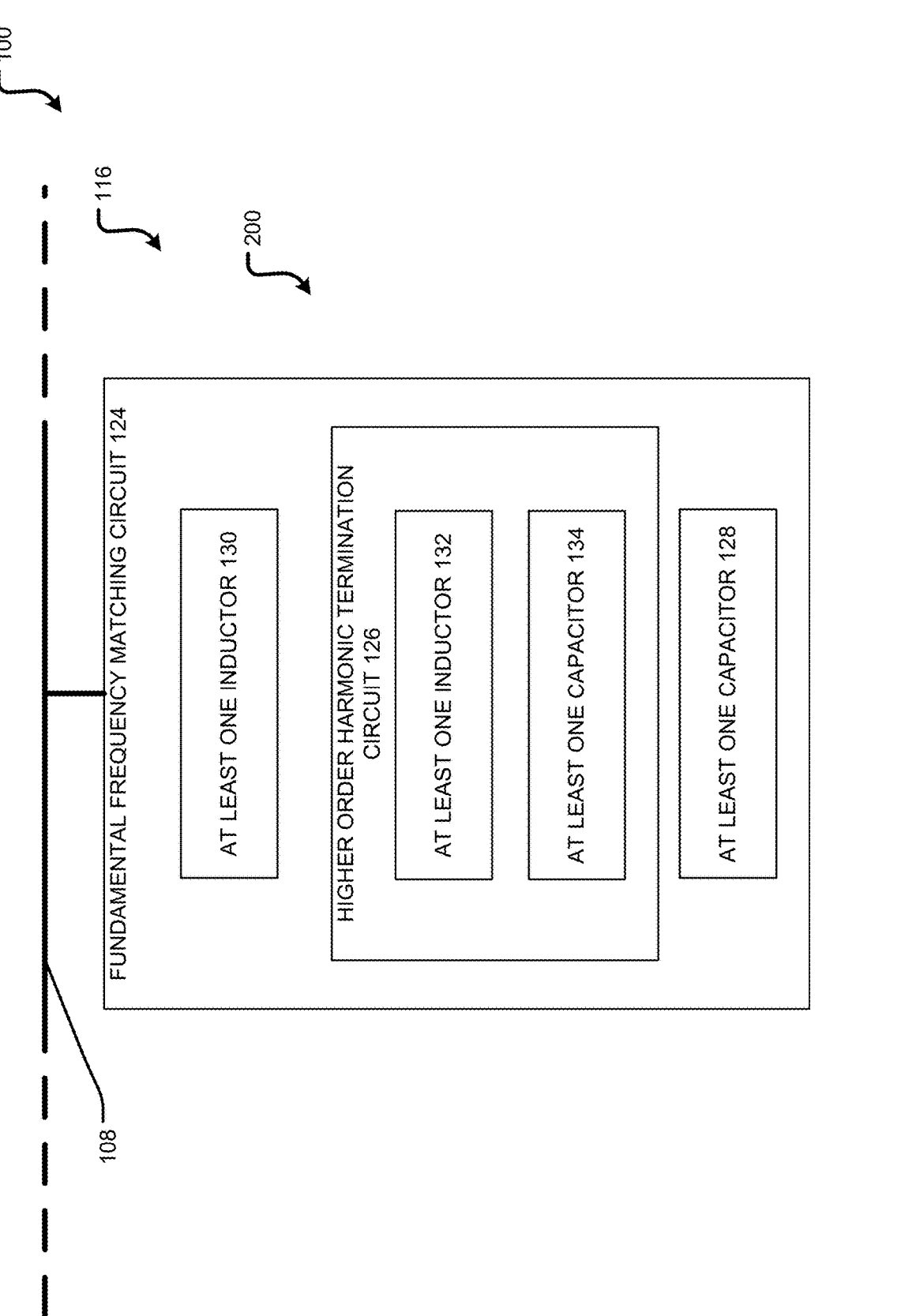
FIG. 2 illustrates a partial more detailed view of the electrical schematic of the amplifier circuit according to FIG. 1.

FIG. 2 illustrates a partial more detailed view of the electrical schematic of the amplifier circuit according to FIG. 1.

The aspects of FIG. 2 may include any other aspects of the disclosure. In particular, FIG. 2 partially illustrates an output impedance matching network 116 including details of the fundamental frequency matching circuit 124 and the higher order harmonic termination circuit 126 of the amplifier circuit 100. The baseband termination circuit 122, the fundamental frequency matching circuit 124, and the higher order harmonic termination circuit 126 may each be provided by a network of reactive components.

In aspects, these reactive components include inductors and capacitors. As will be discussed in further detail below, the parameters of these inductors and capacitors, such as an inductance and a capacitance, are specifically tailored to provide a desired frequency response in a given frequency range. More generally, the reactive components of the output impedance matching network 116 can be provided by any of a variety of components, such as radial stubs, transmission lines, and/or the like, wherein the parameters of these components, such as radius, length, and/or the like are tailored to provide the desired frequency response.

According to an aspect, the fundamental frequency matching circuit 124 may include at least one capacitor 128 and at least one inductor 130. According to an aspect, the higher order harmonic termination circuit 126 may include at least one inductor 132 and at least one capacitor 134.

FIG. 2 further illustrates that portions of the fundamental frequency matching circuit 124 and/or the higher order harmonic termination circuit 126 may be implemented in a SiC IPD 200. The SiC IPD 200 may include and/or may be made of Silicon Carbide (SiC). Generally speaking, the term IPD refers to an integrated circuit (IC), which may be semiconductor based, and includes a number of passive devices integrally formed within and connected to terminals of the IC. A custom circuit topology can be provided by an IPD. A variety of different structures are fabricated within the device to provide the necessary frequency response of a specified passive component (e.g., capacitor, inductor, etc.). Examples of these structures include inductors, parallel plate capacitors, radial stubs, transmission lines, and/or the like.

In this regard, the SiC IPD 200 may implement one or more of the active components of the fundamental frequency matching circuit 124 and/or one or more of the active components of the higher order harmonic termination circuit 126. In aspects, the SiC IPD 200 may implement the at least one capacitor 128 of the fundamental frequency matching circuit 124, the at least one inductor 132 of the higher order harmonic termination circuit 126, and/or the at least one capacitor 134 of the higher order harmonic termination circuit 126. In aspects, the SiC IPD 200 may implement the at least one capacitor 128 of the fundamental frequency matching circuit 124, the at least one inductor 132 of the higher order harmonic termination circuit 126, and the at least one capacitor 134 of the higher order harmonic termination circuit 126. In aspects, the SiC IPD 200 may be electrically connected to the at least one inductor 130 of the fundamental frequency matching circuit 124. In aspects, the SiC IPD 200 may also implement the at least one inductor 130 of the fundamental frequency matching circuit 124. In this regard, the SiC IPD 200 may implement a low loss SiC substrate as loss may be critical for the high efficiency operation of the RF power devices such as the amplifier circuit 100. Additionally, the SiC substrate of the SiC IPD 200 also provides high thermal conductivity resulting in lower temperature of the SiC IPD 200 and/or the amplifier circuit 100.

The components of the fundamental frequency matching circuit 124 are tailored such that the output impedance matching network 116 presents at the output terminal 112 of the RF amplifier device 108 a complex conjugate of an intrinsic impedance of the RF amplifier device 108 in the RF frequency range. As is generally known in the art, optimum power transfer occurs when input and output impedances are matched as complex conjugates of one another. Typically, transistor devices such as GaN based HEMTs have relatively low characteristic input and output impedances (e.g., 2 ohms or less). The fundamental frequency matching circuit 124 matches the output impedance of the RF amplifier device 108 to a fixed value, such as 50 ohms, which corresponds to a standardized value at the system level. In this way, optimum power transfer between the amplifier circuit 100 and other components at the system level can be achieved. Using the exemplary fundamental frequency range of 1.8 GHz (gigahertz) and 2.2 GHz, the parameters of the reactive components in the fundamental frequency matching circuit 124, such as capacitance and inductance, are tailored so that high power transfer (e.g., no greater than −2 dB (decibels)) occurs across the entire fundamental frequency range of 1.8 GHz (gigahertz) to 2.2 GHz. According to an aspect, an optimum power transfer of 0 dB or substantially close to 0 dB occurs at the center frequency of 2.0 GHz.

The components of the higher order harmonic termination circuit 126 are tailored such that the higher order harmonic termination circuit 126 presents low impedance at the output terminal 112 of the RF amplifier device 108 in one or more higher order harmonic frequency ranges. In aspects, the components of the higher order harmonic termination circuit 126 are tailored such that the higher order harmonic termination circuit 126 presents low impedance at the output terminal 112 of the RF amplifier device 108 in the second order harmonic frequency range.

Filtering out higher order harmonic components of the RF signal can substantially improve the efficiency of the device. By mitigating harmonic oscillation at the output of the device, the shapes of the voltage and current waveforms during a transitional state are beneficially controlled for minimal overlap and hence greater efficiency. This is done by including a short circuit path for even higher ordered harmonics (e.g., $2F_0$, $4F_0$, $6F_0$, etc.) of the fundamental frequency $F_0$ of the RF signal being amplified. In aspects, the higher order harmonic termination circuit 126 is tailored to provide a short circuit path (from an RF perspective) at the second order harmonic of the fundamental frequency, e.g., 4.0 GHz in the exemplary fundamental frequency range.

That is, the second order harmonic termination is designed to terminate the RF signals in this frequency range such that they do not appear at the output port 104. In other aspects, the higher order harmonic termination circuit 126 is tailored to provide a short circuit path (from an RF perspective) at frequency ranges greater than the second order harmonic of the fundamental frequency.

Figure 3:
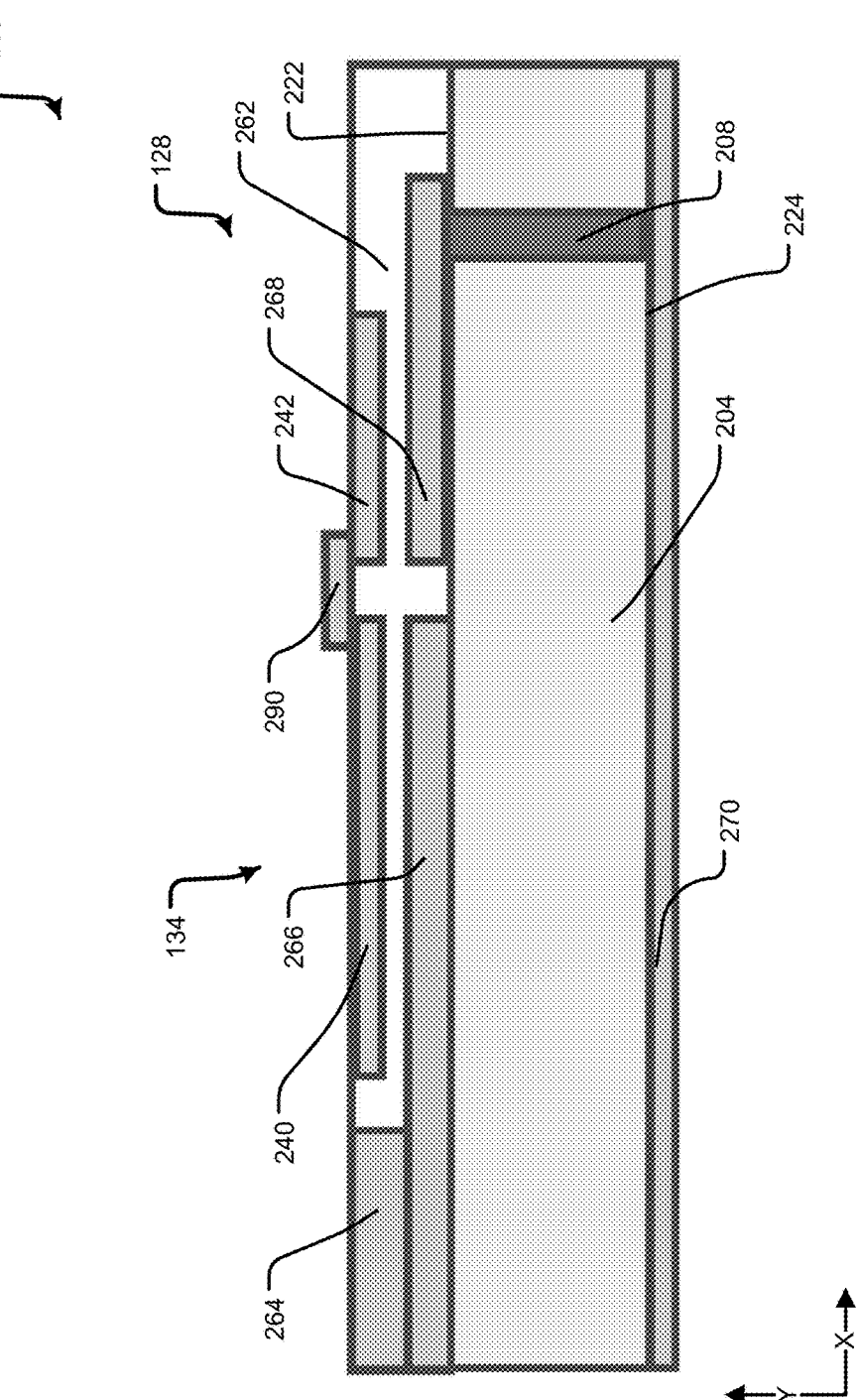
FIG. 3 illustrates a cross-sectional side view of the SiC IPD according to aspects of the disclosure.

FIG. 3 illustrates a cross-sectional side view of the SiC IPD according to aspects of the disclosure.

Figure 4:
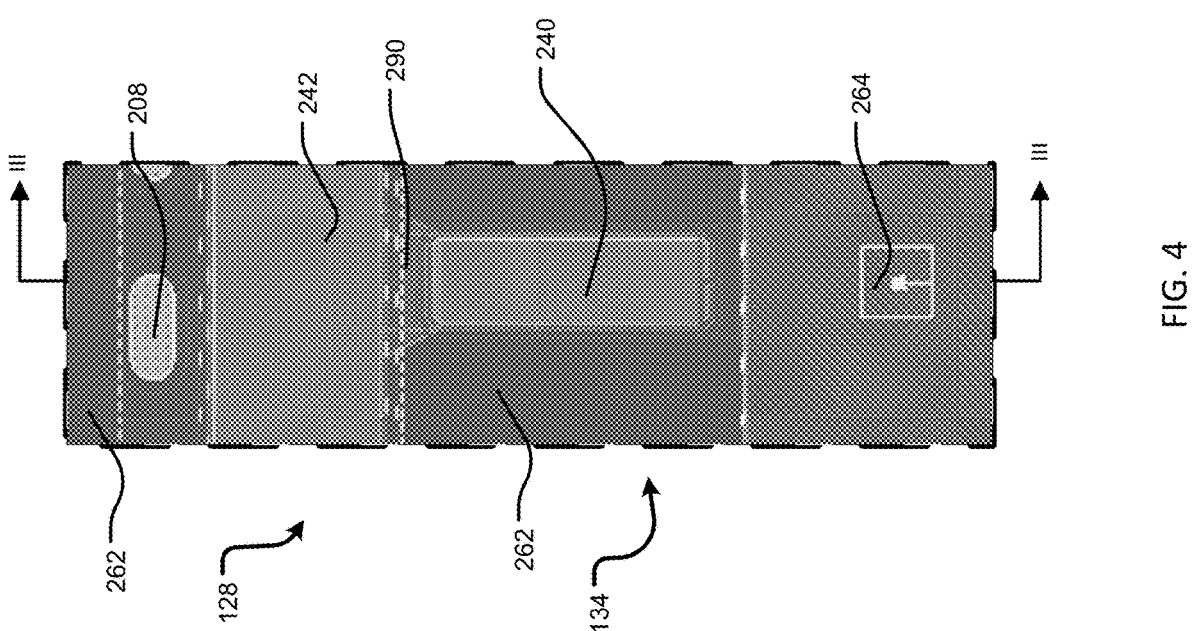
FIG. 4 illustrates a top view of the SiC IPD according to FIG. 3.

FIG. 4 illustrates a top view of the SiC IPD according to FIG. 3.

The aspects of FIG. 3 and FIG. 4 may include any other aspects of the disclosure. In particular, FIG. 3 and FIG. 4 illustrate further details of the SiC IPD 200. The SiC IPD 200 may include a substrate 204, a dielectric layer 262, a first bottom metal 266, a second bottom metal 268, a first metallization layer 240, a second metallization layer 242, and/or the like. FIG. 3 illustrates a cross-section of the SiC IPD 200 illustrated in FIG. 4 along the line III-III.

In particular aspects, the SiC IPD 200 may form the at least one capacitor 128 of the fundamental frequency matching circuit 124 with the second metallization layer 242 and the second bottom metal 268 having the dielectric layer 262 therebetween. In this regard, the second metallization layer 242 may implement a first plate of the at least one capacitor 128, the second bottom metal 268 may implement a second plate of the at least one capacitor 128, and the dielectric layer 262 may form the conductive region between the second metallization layer 242 and the second bottom metal 268.

In particular aspects, the SiC IPD 200 may form the at least one capacitor 134 of the higher order harmonic termination circuit 126 with the first metallization layer 240 and the first bottom metal 266 having the dielectric layer 262 therebetween. In this regard, the first metallization layer 240 may implement a first plate of the at least one capacitor 134, the first bottom metal 266 may implement a second plate of the at least one capacitor 134, and the dielectric layer 262 may form the conductive region between the first metallization layer 240 and the first bottom metal 266.

In aspects, the SiC IPD 200 may further include a connection pad 264 and a connection 290. The connection pad 264 may connect the SiC IPD 200 to other portions of the fundamental frequency matching circuit 124, the RF amplifier device 108, other portions of the amplifier circuit 100, the series branch 118, the parallel branch 120, the output terminal 112, the output port 104, and/or the like. In particular aspects, the connection pad 264 may connect to the at least one inductor 130 of the fundamental frequency matching circuit 124. In aspects, the connection may be by an adhesive, soldering, sintering, eutectic bonding, thermal compression bonding, ultrasonic bonding/welding, a clip component, and/or the like as described herein.

The connection 290 may connect portions of the fundamental frequency matching circuit 124 to portions of the higher order harmonic termination circuit 126. In particular aspects, the connection 290 may connect the at least one capacitor 128 to the at least one capacitor 134. The connection 290 may be configured as a metallization electrically connecting the second metallization layer 242 to the first metallization layer 240. The connection 290 may be arranged at least partially as well on the dielectric layer 262.

The substrate 204 may include and/or may be made of Silicon Carbide (SiC). In this regard, the SiC IPD 200 may implement a low loss SiC substrate as loss may be critical for the high efficiency operation of the RF power devices such as the amplifier circuit 100. Additionally, the SiC substrate of the SiC IPD 200 also provides high thermal conductivity resulting in lower temperature of the SiC IPD 200 and/or the amplifier circuit 100. The substrate 204 may include an upper surface 222. The upper surface 222 may support the first bottom metal 266 and the second bottom metal 268.

In some aspects, the substrate 204 may be a semi-insulating SiC substrate, a p-type substrate, an n-type substrate, and/or the like. In some aspects, the substrate 204 may be very lightly doped. In one aspect, the substrate 204 may be formed of SiC selected from the group of 6H, 4H, 15R, 3C SiC, or the like. In one aspect, the substrate 204 may be formed of SiC that may be semi-insulating and doped with vanadium or any other suitable dopant or undoped of high purity with defects providing the semi-insulating properties. In other aspects, the substrate 204 may include silicon, Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material.

The substrate 204 may include a lower surface 224. The SiC IPD 200 may include a metallization layer 270 located on the lower surface 224 of the substrate 204 opposite the upper surface 222. The metallization layer 270 may be located in a plane generally parallel to the x-axis or a plane generally parallel to the upper surface 222. In one aspect, the metallization layer 270 may be continuous. In one aspect, the metallization layer 270 may be discontinuous or segmented. The metallization layer 270 may comprise a metallic material such as copper, gold, nickel, palladium, silver, tin, a gold tin alloy, and the like, and combinations thereof. In one aspect, the metallization layer 270 may have a thickness along the y-axis of 1 microns to 9 microns, 1 microns to 2 microns, 2 microns to 3 microns, 3 microns to 4 microns, 4 microns to 5 microns, 5 microns to 6 microns, 6 microns to 7 microns, 7 microns to 8 microns, or 8 microns to 9 microns.

Additionally, the SiC IPD 200 may include an electrical connection between the second bottom metal 268 and the metallization layer 270 such as vias 208. However, any type of electrical connection is contemplated. In particular aspects, the substrate 204 of the SiC IPD 200 may include the vias 208 extending along the y-axis through the substrate 204. One or more of the vias 208 may be electrically connected to the second bottom metal 268 and may be electrically connected to the metallization layer 270.

The vias 208 may be metallic plated holes or metallic filled holes that may function as electrical tunnels through the substrate 204. The vias 208 may comprise a metallic material such as copper, gold, nickel, palladium, silver, tin, a gold tin alloy, and the like, and combinations thereof. The vias 208 may have an axis that may be located in a plane generally perpendicular to the x-axis, a plane generally parallel to the x-axis, and/or a plane generally perpendicular to the upper surface 222.

Figure 5:
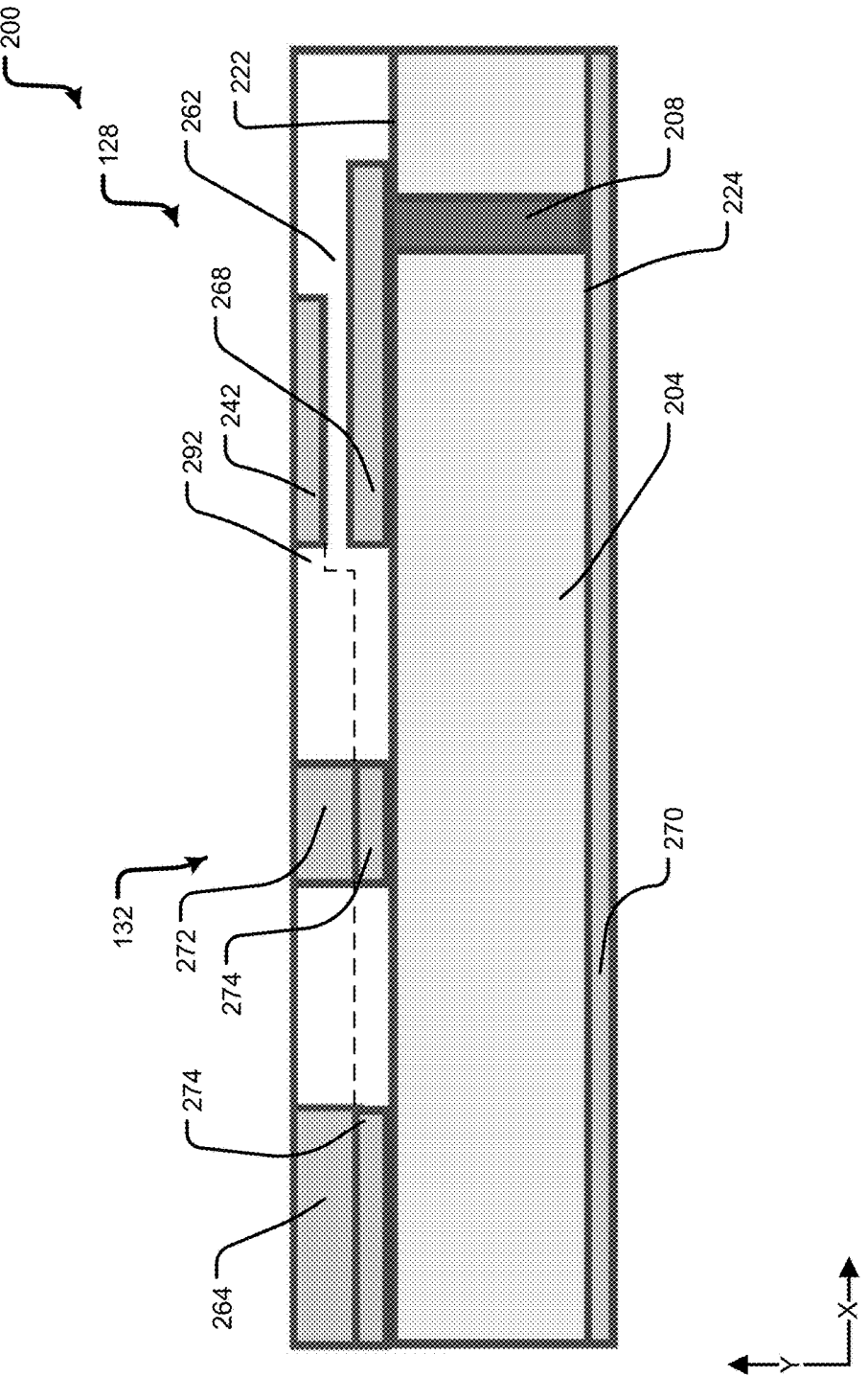
FIG. 5 illustrates a cross-sectional side view of the SiC IPD according to FIG. 3.

FIG. 5 illustrates a cross-sectional side view of the SiC IPD according to FIG. 3.

Figure 6:
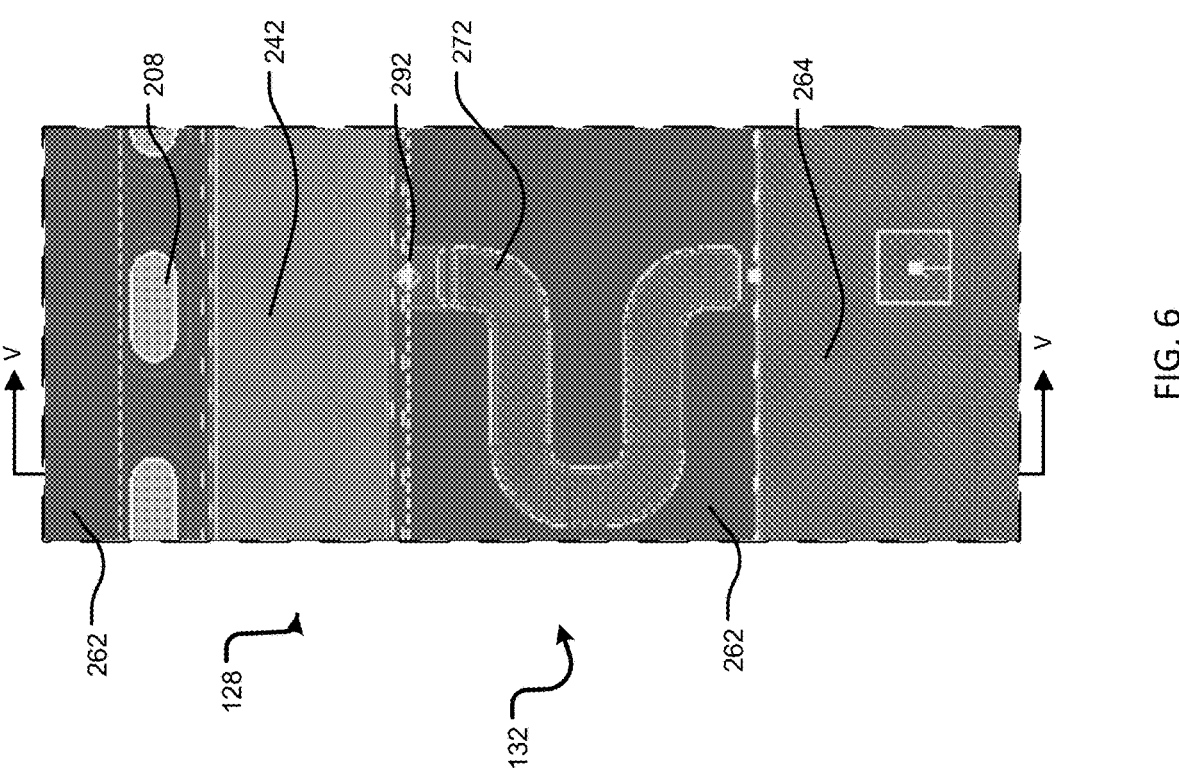
FIG. 6 illustrates a top view of the SiC IPD according to FIG. 5.

FIG. 6 illustrates a top view of the SiC IPD according to FIG. 5.

The aspects of FIG. 5 and FIG. 6 may include any other aspects of the disclosure. In particular, FIG. 5 and FIG. 6 illustrate further details of the SiC IPD 200. As described above, the SiC IPD 200 may implement the at least one capacitor 128. In aspects illustrated in FIG. 5 and FIG. 6, the SiC IPD 200 may further implement an/or may alternatively implement the at least one inductor 132. In this regard, the SiC IPD 200 may include a metal inductor layer 272. The construction and arrangement of the metal inductor layer 272 may be configured to provide the desired inductance for implementation of the at least one inductor 132. The metal inductor layer 272 may be configured as a metal trace, a metal printed portion, and/or the like. The metal inductor layer 272 may extend as shown by the dashed lines to electrically connect to the second metallization layer 242 and the connection pad 264. As illustrated in FIG. 6, the metal inductor layer 272 may connect via a connection portion 292 to the second metallization layer 242. Additionally, the metal inductor layer 272 may extend to the connection pad 264 and electrically connect the metal inductor layer 272 to the connection pad 264.

Additionally, the connection pad 264 and/or the metal inductor layer 272 may be arranged on a first metal portion 274. FIG. 5 illustrates a cross-section of the SiC IPD 200 of FIG. 6 along a line V-V as illustrated in FIG. 6. In particular, FIG. 6 illustrates a construction of the first metal portion 274 being configured to implement the at least one inductor 132.

Figure 7:
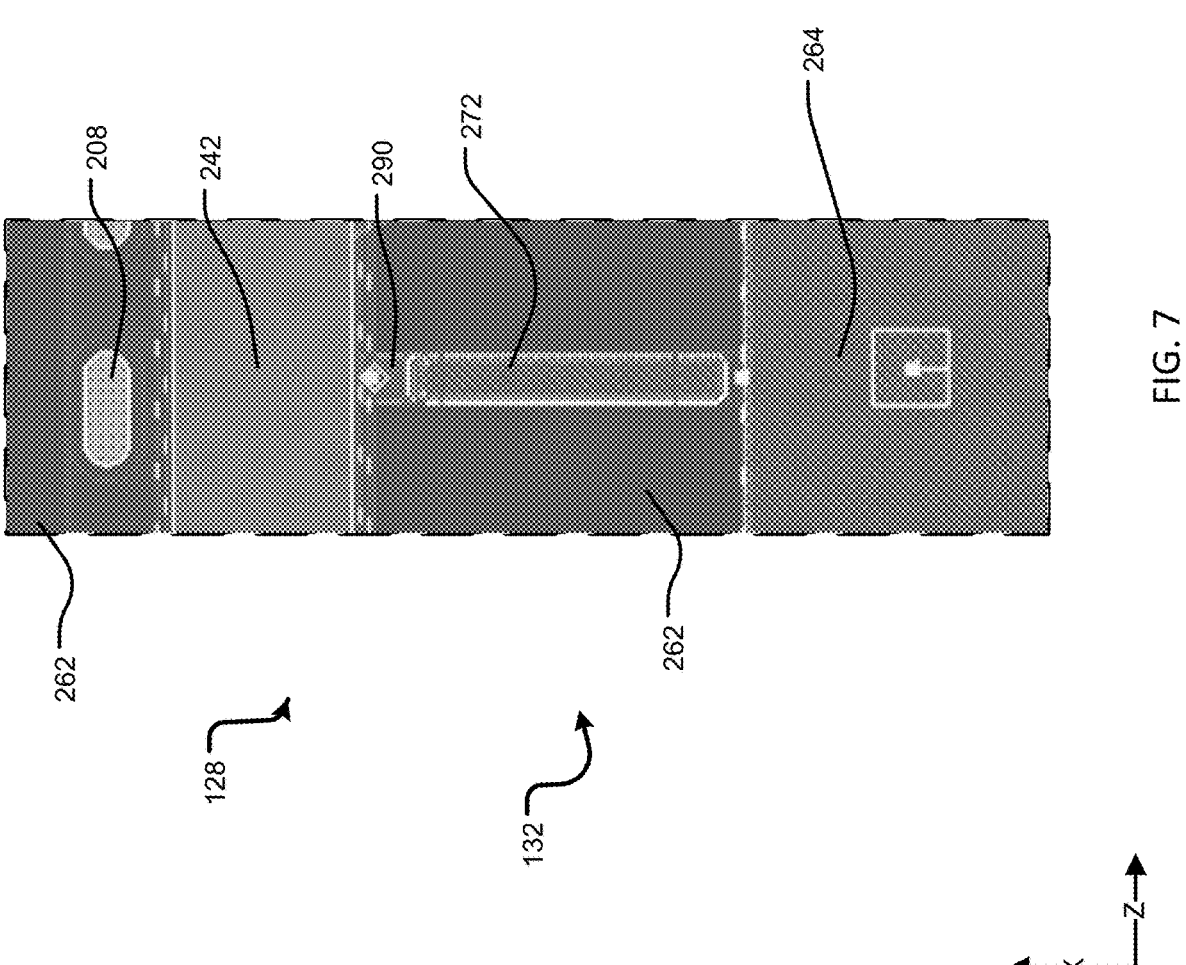
FIG. 7 illustrates a top view of the SiC IPD 200 according to aspects of the disclosure.

FIG. 7 illustrates a top view of the SiC IPD 200 according to aspects of the disclosure.

The aspects of FIG. 7 may include any other aspects of the disclosure. In particular, FIG. 7 further details another implementation of the metal inductor layer 272 of the at least one inductor 132 of the SiC IPD 200. As described above, the SiC IPD 200 may implement the at least one capacitor 128. In aspects, the SiC IPD 200 may further implement the at least one inductor 132. In this regard, the SiC IPD 200 may include the metal inductor layer 272. The construction and arrangement of the metal inductor layer 272 may be configured to provide the desired inductance for implementation of the at least one inductor 132. In this regard, FIG. 6 illustrates a first meandering trace configuration of the metal inductor layer 272 and FIG. 7 illustrates a second straight line trace configuration of the metal inductor layer 272. Other configurations are contemplated as well including spiral shaped configurations.

The connection pad 264, the first metallization layer 240, the second metallization layer 242, the first bottom metal 266, the metal inductor layer 272, the first metal portion 274, and/or the second bottom metal 268, may be arranged in a parallel to the x-axis as illustrated and/or in a plane perpendicular to the y-axis. The connection pad 264, the first metallization layer 240, the second metallization layer 242, the first bottom metal 266, the metal inductor layer 272, the first metal portion 274, and/or the second bottom metal 268 may be continuous or discontinuous.

The connection pad 264 may be arranged vertically above the first bottom metal 266 and/or the first metal portion 274 along the y-axis as illustrated. The connection pad 264 may be electrically connected to the first bottom metal 266 and/or portions of the first metal portion 274. The first metallization layer 240 and/or the metal inductor layer 272 may be arranged vertically above the first bottom metal 266 along the y-axis as illustrated. The first metallization layer 240 may be electrically connected to the connection 290 and/or the second metallization layer 242. The first metallization layer 240 and/or second metallization layer 242 may be arranged on the dielectric layer 262.

The connection 290 may be arranged vertically above the first bottom metal 266, the first metallization layer 240, the second metallization layer 242, and/or the second bottom metal 268 along the y-axis as illustrated. The connection 290 may be arranged on the first metallization layer 240, the dielectric layer 262, and/or the second metallization layer 242. The connection 290 may be electrically coupled to the first metallization layer 240 and/or the second metallization layer 242. The connection pad 264, the first metallization layer 240, and/or the second metallization layer 242 may be arranged vertically above the first bottom metal 266 and/or the second bottom metal 268 along the y-axis as illustrated.

The first bottom metal 266, the second bottom metal 268, and/or the first metal portion 274 may be arranged on the upper surface 222 of the substrate 204. In particular, there may be one or more intervening layers or structures between the upper surface 222 of the substrate 204 and the first bottom metal 266 (not shown); and there may be one or more intervening layers or structures between the upper surface 222 of the substrate 204 and the second bottom metal 268 (not shown). In other aspects, the first bottom metal 266 may be directly arranged on the upper surface 222 of the substrate 204. In other aspects, the second bottom metal 268 may be directly arranged on the upper surface 222 of the substrate 204. In one aspect, the first bottom metal 266 and/or the second bottom metal 268 may be continuous. In one aspect, the first bottom metal 266 and/or the second bottom metal 268 may be discontinuous or segmented.

The first bottom metal 266, the first metal portion 274, and/or the second bottom metal 268 may be formed as a metal surface on the upper surface 222 of the substrate 204 and may comprise a metallic material such as copper, gold, nickel, palladium, silver, tin, a gold tin alloy, and the like, and combinations thereof. In one aspect, the first bottom metal 266, the first metal portion 274, and the second bottom metal 268 may have a thickness along the y-axis of 0.1 microns to 0.6 microns, 0.1 microns to 0.2 microns, 0.2 microns to 0.3 microns, 0.3 microns to 0.4 microns, 0.4 microns to 0.5 microns, or 0.5 microns to 0.6 microns.

The dielectric layer 262 may be arranged on the first bottom metal 266 and the second bottom metal 268. In particular, there may be one or more intervening layers or structures between the dielectric layer 262 and the first bottom metal 266 (not shown); and there may be one or more intervening layers or structures between the dielectric layer 262 and the second bottom metal 268 (not shown). In other aspects, the dielectric layer 262 may be directly arranged on the first bottom metal 266; and/or the dielectric layer 262 may be directly arranged on the second bottom metal 268. In one aspect, the dielectric layer 262 may be continuous.

The dielectric layer 262 may include SiN, AlO, SiO, SiO$_2$, AlN, or the like or combinations thereof together with other intervening layers. The dielectric layer 262 may have any thickness along a y-axis to provide the desired capacitance density, capacitance, standoff voltage, and/or the like. In some aspects, the dielectric layer 262 may have a thickness along the y-axis of 100 Å to 11000 Å, 100 Å to 1000 Å, 1000 Å to 2000 Å, 2000 Å to 3000 Å, 3000 Å to 4000 Å, 4000 Å to 5000 Å, 5000 Å to 6000 Å, 6000 Å to 7000 Å, 7000 Å to 8000 Å, 8000 Å to 9000 Å, 9000 Å to 10000 Å, or 10000 Å to 11000 Å. In some aspects, the dielectric layer 262 may have a thickness along the y-axis of greater than 10000 Å.

The first metallization layer 240 may be arranged on the dielectric layer 262. In particular, there may be one or more intervening layers or structures between the first metallization layer 240 (not shown). In other aspects, the first metallization layer 240 may be directly arranged on the dielectric layer 262. The second metallization layer 242 may be arranged on the dielectric layer 262. In particular, there may be one or more intervening layers or structures between the second metallization layer 242 (not shown). In other aspects, the second metallization layer 242 may be directly arranged on the dielectric layer 262.

The first metallization layer 240 and/or the second metallization layer 242 may be formed as a metal surface on an upper surface the dielectric layer 262 and may comprise a metallic material such as copper, gold, nickel, palladium, silver, tin, a gold tin alloy, and the like, and combinations thereof. In some aspects, the first metallization layer 240 and/or the second metallization layer 242 may comprise stacked layers. In one aspect, the first metallization layer 240 and/or the second metallization layer 242 may have a thickness along the y-axis of 0.1 microns to 7 microns, 0.1 microns to 0.2 microns, 0.2 microns to 0.3 microns, 0.3 microns to 0.4 microns, 0.4 microns to 0.5 microns, 0.5 microns to 0.6 microns, 0.6 microns to 0.7 microns, 0.7 microns to 1 microns, 1 microns to 2 microns, 2 microns to 3 microns, 3 microns to 4 microns, 4 microns to 5 microns, 5 microns to 6 microns, or 6 microns to 7 microns.

Figure 8A:
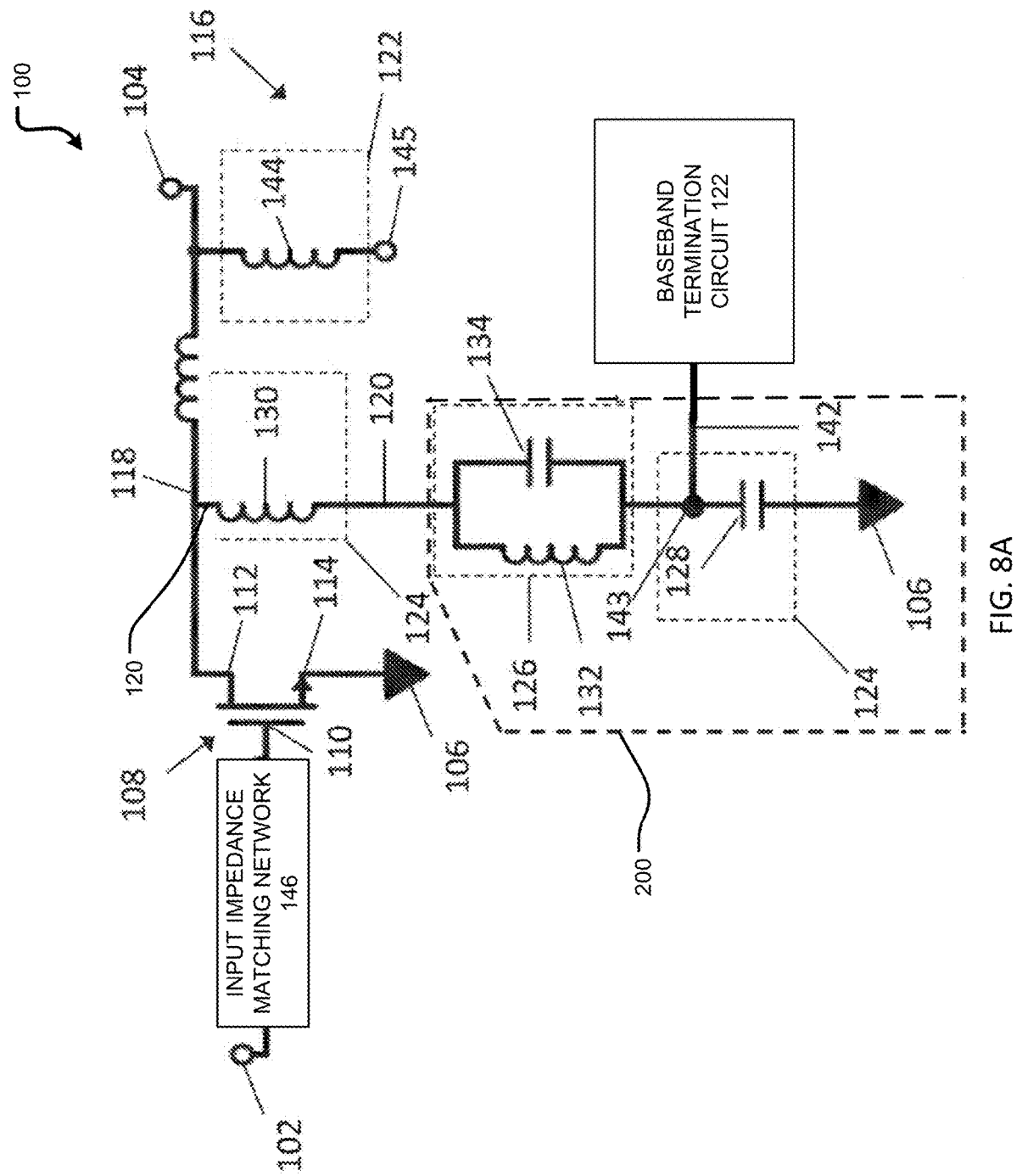
FIG. 8A illustrates an exemplary electrical schematic of the amplifier circuit according to FIG. 1.

FIG. 8A illustrates an exemplary electrical schematic of the amplifier circuit according to FIG. 1.

The aspects of FIG. 8A may include any other aspects of the disclosure. As illustrated in FIG. 8A, the at least one inductor 132 of the higher order harmonic termination circuit 126, the at least one capacitor 134 of the higher order harmonic termination circuit 126, and the at least one capacitor 128 of the fundamental frequency matching circuit 124 are illustrated as being part of the SiC IPD 200. In particular aspects illustrated in FIG. 8A, the at least one inductor 132 and the at least one capacitor 134 may be in parallel with one another along the parallel branch 120 of the output impedance matching network 116. Thus, the at least one inductor 132 and the at least one capacitor 134 form a second parallel LC resonator. The at least one capacitor 128 and the at least one inductor 130 may be connected in series with one another along the parallel branch 120. The inductance of the at least one inductor 130 is tailored to provide impedance matching with respect to the characteristic impedance of the RF amplifier device 108. In other aspects, the baseband termination circuit 122 may be implemented by the SiC IPD 200 as well.

The parameters of the second LC resonator, i.e., the capacitance of the at least one capacitor 134 and the inductance of the at least one inductor 132, are tailored to provide a low impedance path for the second order harmonic between the output terminal 112 of the RF amplifier device 108 and the reference potential terminal 114. This tailoring of the parameters of the second LC resonator accounts for the collective effect of the other reactance values in the output impedance matching network 116, including the first parallel LC resonator that includes the at least one inductor 130 and the intrinsic capacitance of the RF amplifier device 108. As is generally known, a parallel resonant circuit becomes more capacitive as frequency values increase beyond the resonant frequency and becomes more inductive as frequency values decrease below the resonant frequency. Applying this principle, the resonant frequency of the second parallel LC resonator can be tailored such that the second parallel LC resonator is relatively inductive or capacitive at the second order harmonic so as to compensate for other reactive components in the transmission path between the output terminal 112 of the RF amplifier and the reference potential terminal 114, e.g., the first parallel resonator. That is, the parameters of the second parallel LC resonator can be selected such that the output impedance matching network 116 presents an RF short at the output terminal 112 of the RF amplifier at the second order harmonic of the fundamental frequency, e.g., 4.0 GHz.

The baseband termination circuit 122 is tailored to present low impedance in the baseband frequency region that is below the RF frequency range. By suppressing these lower frequency values, the effects of inter-modulation-distortion (IMD) across the baseband frequency range can be mitigated, thereby improving the linear efficiency of the amplifier circuit 100. The parameters of the baseband termination circuit 122 (e.g., capacitance and inductance) are selected such that the impedance matching circuit suppresses these lower frequency values. That is, the baseband termination circuit 122 provides a low impedance path (from an RF perspective) from the output terminal 112 of the RF amplifier device 108 to the reference potential terminal 114 for frequencies that lie in this range.

Figure 8B:
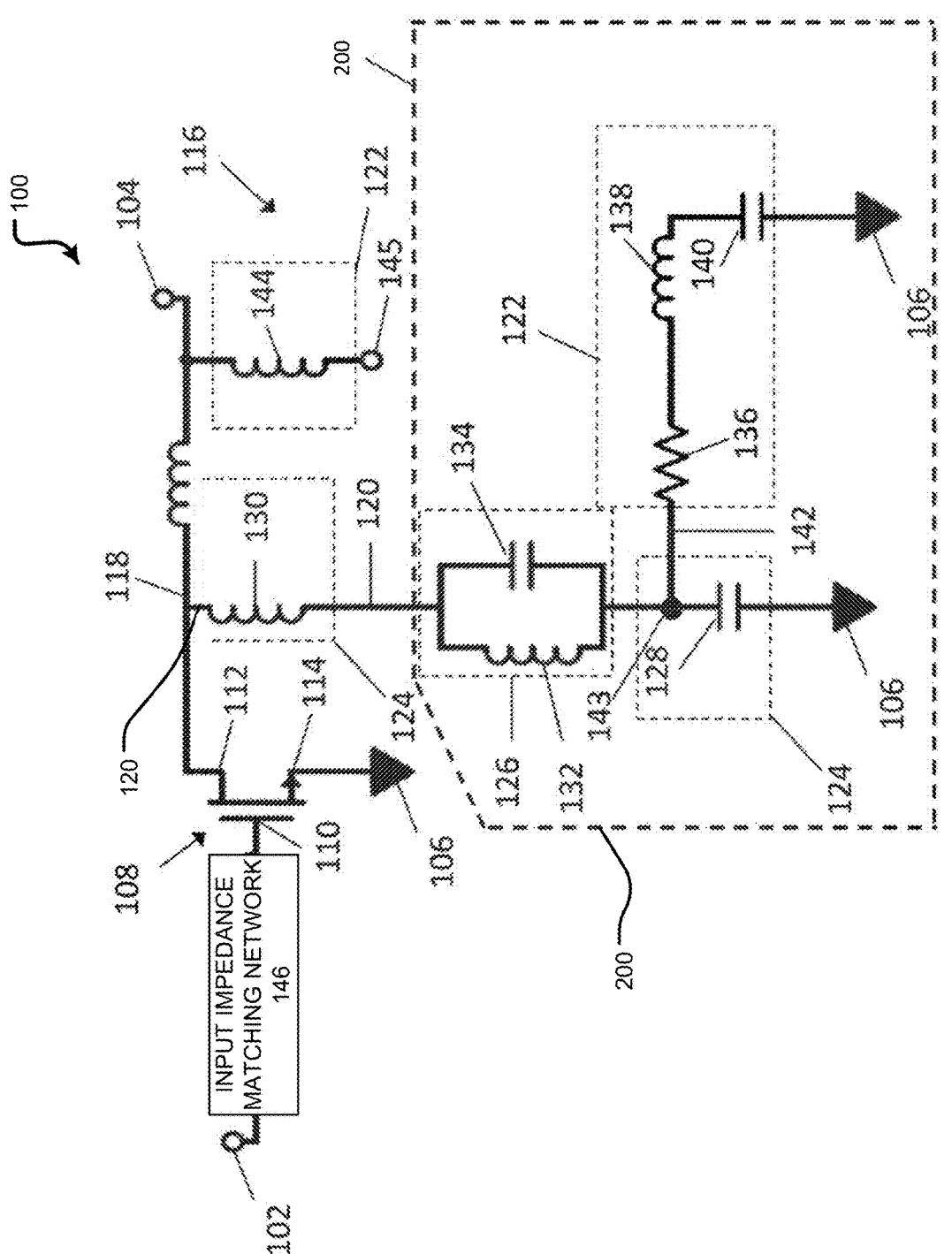
FIG. 8B illustrates another exemplary electrical schematic of the amplifier circuit according to FIG. 1.

FIG. 8B illustrates another exemplary electrical schematic of the amplifier circuit according to FIG. 1.

The aspects of FIG. 8B may include any other aspects of the disclosure. According to an aspect illustrated in FIG. 8B, the baseband termination circuit 122 may include a first resistor 136, a third inductor 138, and a third capacitor 140. Each of these components may be connected on a second branch 142 of the output impedance matching network 116. The second branch 142 of the output impedance matching network 116 is connected between a first node 143 that directly connects the at least one capacitor 128 to the second parallel LC resonator and the reference potential port.

The parameter values of the components in the baseband termination circuit 122 (i.e., resistance, inductance and capacitance) are selected to present low impedance response across a broadband baseband frequency region. Using a baseband frequency range of 400 MHz as an example, the parameters of the third inductor 138 and the third capacitor 140 can be selected such that these components in conjunction with the other components of the impedance matching circuit form a low impedance path from the output terminal 112 of the RF amplifier device 108 to the reference potential terminal 114. By tailoring the resistance of the first resistor 136, the impedance response of the baseband termination circuit 122 is flattened for better performance across the broadband frequency range. That is, the first resistor 136 is used to make the impedance response of the baseband termination circuit 122 less frequency dependent.

Optionally, the output impedance matching network 116 can include a fourth inductor 144 that is connected between the series branch 118 and a DC terminal 145 of the amplifier circuit 100. The fourth inductor 144 is configured as an RF choke, i.e., a device that blocks higher frequency values while transmitting lower frequency values. This RF choke can be used in conjunction with the first resistor 136, the third inductor 138, and the third capacitor 140 to present low impedance in the baseband frequency region.

Figure 8C:
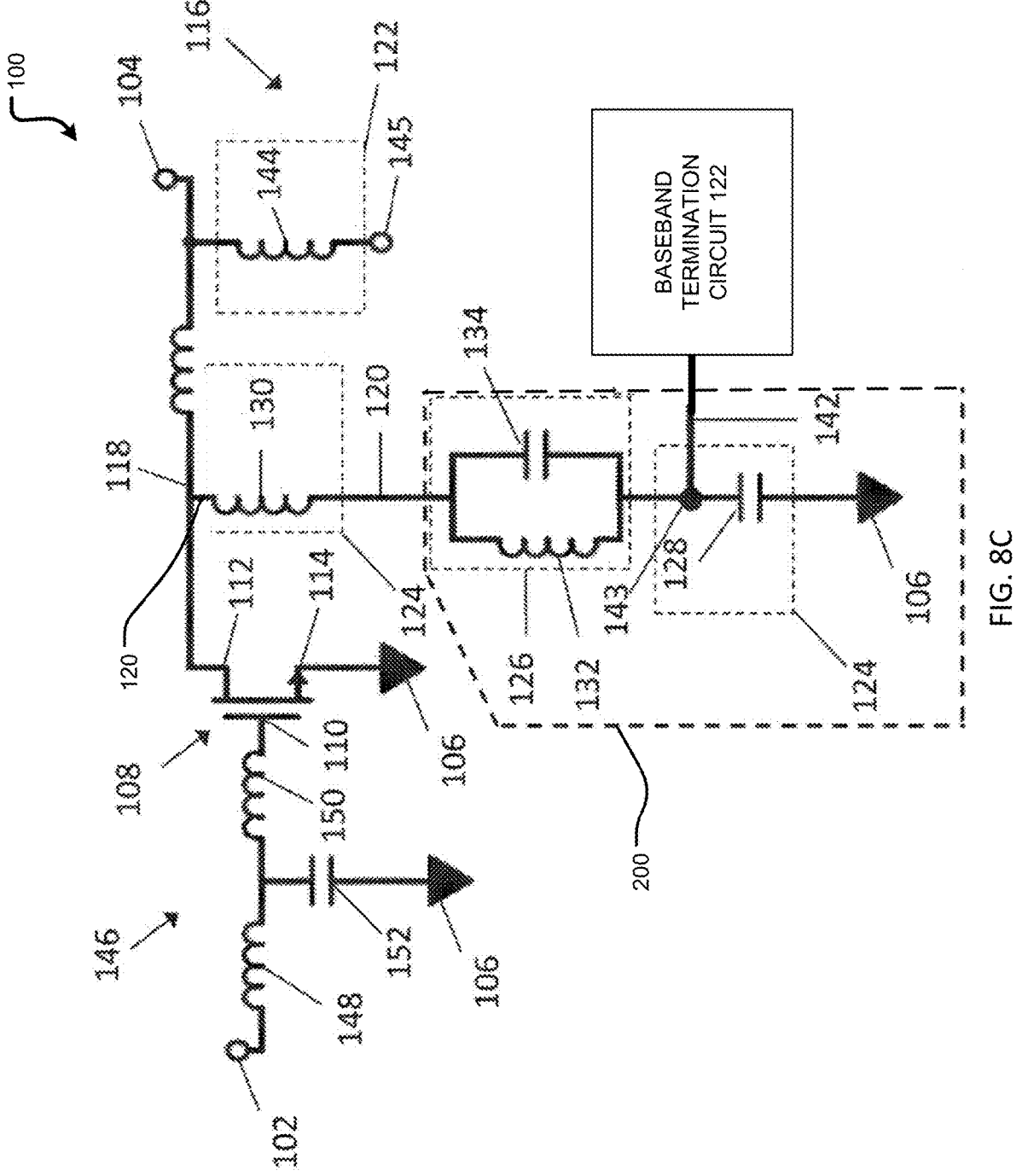
FIG. 8C illustrates another exemplary electrical schematic of the amplifier circuit according to FIG. 1.

FIG. 8C illustrates another exemplary electrical schematic of the amplifier circuit according to FIG. 1.

The aspects of FIG. 8C may include any other aspects of the disclosure. According to an aspect illustrated in FIG. 8C, the input impedance matching network 146 includes a fifth inductor 148 and a sixth inductor 150 connected in series between the input port 102 and the input terminal 110 of the RF amplifier device 108, and a fourth capacitor 152 connected in parallel with the input terminal 110 of the RF amplifier device 108 and the reference potential terminal 114. According to one aspect, the parameters of the sixth inductor 150 and the fourth capacitor 152 are tailored for impedance matching between the input capacitance of the RF amplifier device 108 and a fixed impedance value at the board level (e.g., 50 ohms) in the fundamental frequency range in a similar manner previously discussed.

In the depicted circuit, the at least one inductor 130 is in parallel with the output of the RF amplifier device 108. Therefore, the output capacitance of the RF amplifier device 108 and the at least one inductor 130 form a first parallel LC resonator. As is generally known in the art, parallel LC circuits provide maximum impedance (from an RF perspective) at a resonant frequency, i.e., the point at which reactive branch currents are equal and opposite. According to an aspect, the inductance of the at least one inductor 130 is tailored such that the first parallel LC resonator resonates at the center frequency of 2.0 GHz. The at least one capacitor 128 is configured as a DC blocking capacitor that blocks very low frequencies (e.g., frequencies of less than 10 MHz) and DC signals. Thus, the DC blocking capacitor has a very large capacitance value. Accordingly, at much higher frequency values including the fundamental frequency range, the at least one capacitor 128 appears as an RF short at the fundamental frequency. In this way, the effects of the at least one capacitor 128 on the first parallel LC resonator can be disregarded when tailoring the parameters of the first parallel LC resonator.

Accordingly, aspects of the SiC IPD 200 may be implemented in the amplifier circuit 100 illustrated in FIG. 1, the amplifier circuit 100 illustrated in FIG. 8A, the amplifier circuit 100 illustrated in FIG. 8B, the amplifier circuit 100 illustrated in FIG. 8C, and/or other implementations of the amplifier circuit 100.

Figure 9:
FIG. 9 illustrates an exemplary implementation of the SiC IPD according to aspects of the disclosure.

FIG. 9 illustrates an exemplary implementation of the SiC IPD according to aspects of the disclosure.

The aspects of FIG. 9 may include any other aspects of the disclosure. In particular, FIG. 9 illustrates a layout of the SiC IPD 200 implementing the at least one capacitor 128, the at least one inductor 132, the at least one capacitor 134, and/or the like consistent with the arrangement of the fundamental frequency matching circuit 124 and the higher order harmonic termination circuit 126 illustrated in FIG. 8A.

Figure 10:
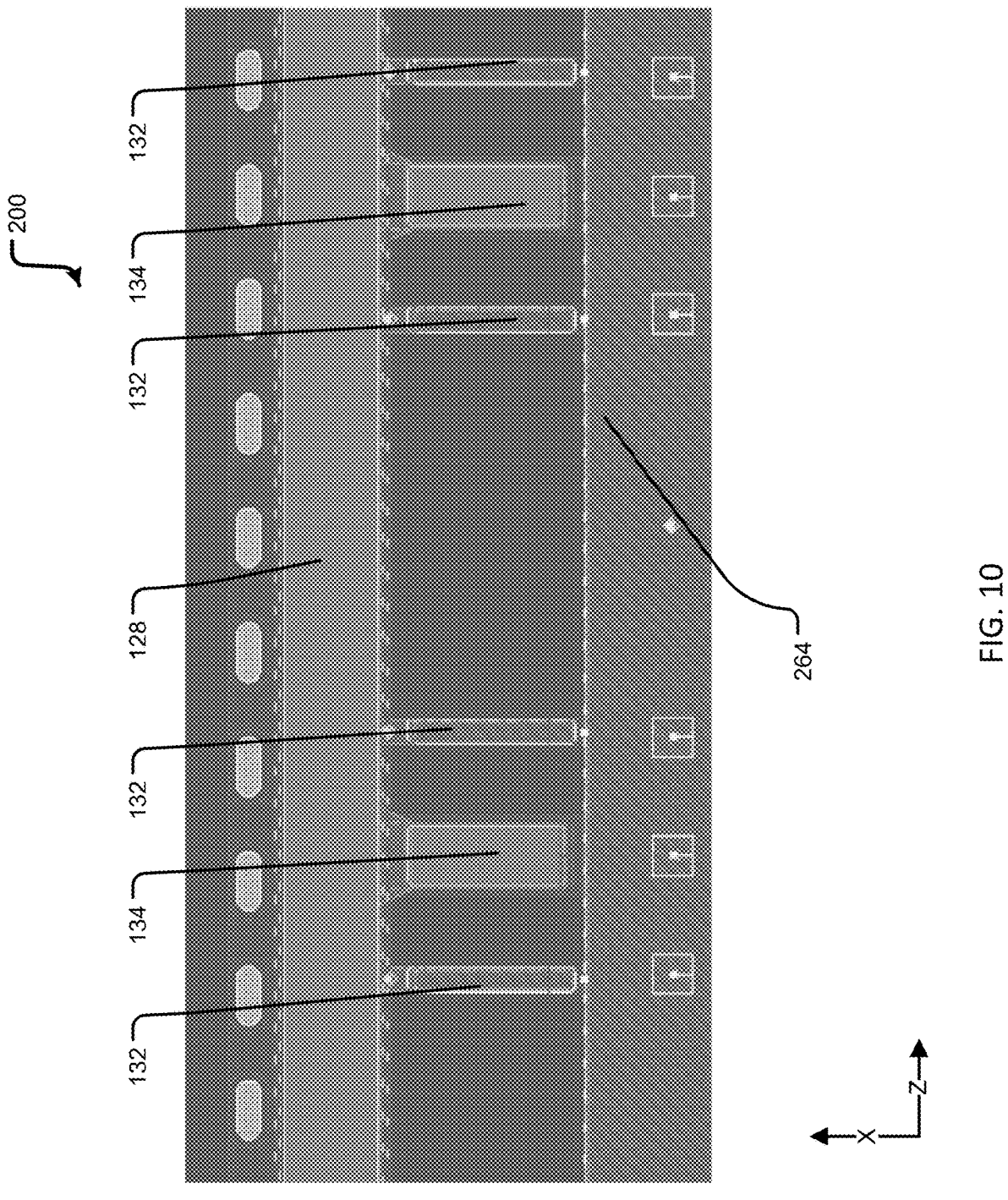
FIG. 10 illustrates an exemplary implementation of the SiC IPD according to aspects of the disclosure.

FIG. 10 illustrates an exemplary implementation of the SiC IPD according to aspects of the disclosure.

The aspects of FIG. 10 may include any other aspects of the disclosure. In particular, FIG. 10 illustrates a layout of the SiC IPD 200 implementing the at least one capacitor 128, the at least one inductor 132, the at least one capacitor 134, and/or the like consistent with the arrangement of the fundamental frequency matching circuit 124 and the higher order harmonic termination circuit 126 illustrated in FIG. 8A. Additionally, the SiC IPD 200 illustrated in FIG. 10 may include a plurality of the at least one capacitor 134 arranged in parallel between the at least one capacitor 128 and the connection pad 264; and the SiC IPD 200 illustrated in FIG. 10 may include a plurality of the at least one inductor 132 arranged in parallel between the at least one capacitor 128 and the connection pad 264.

Figure 11:
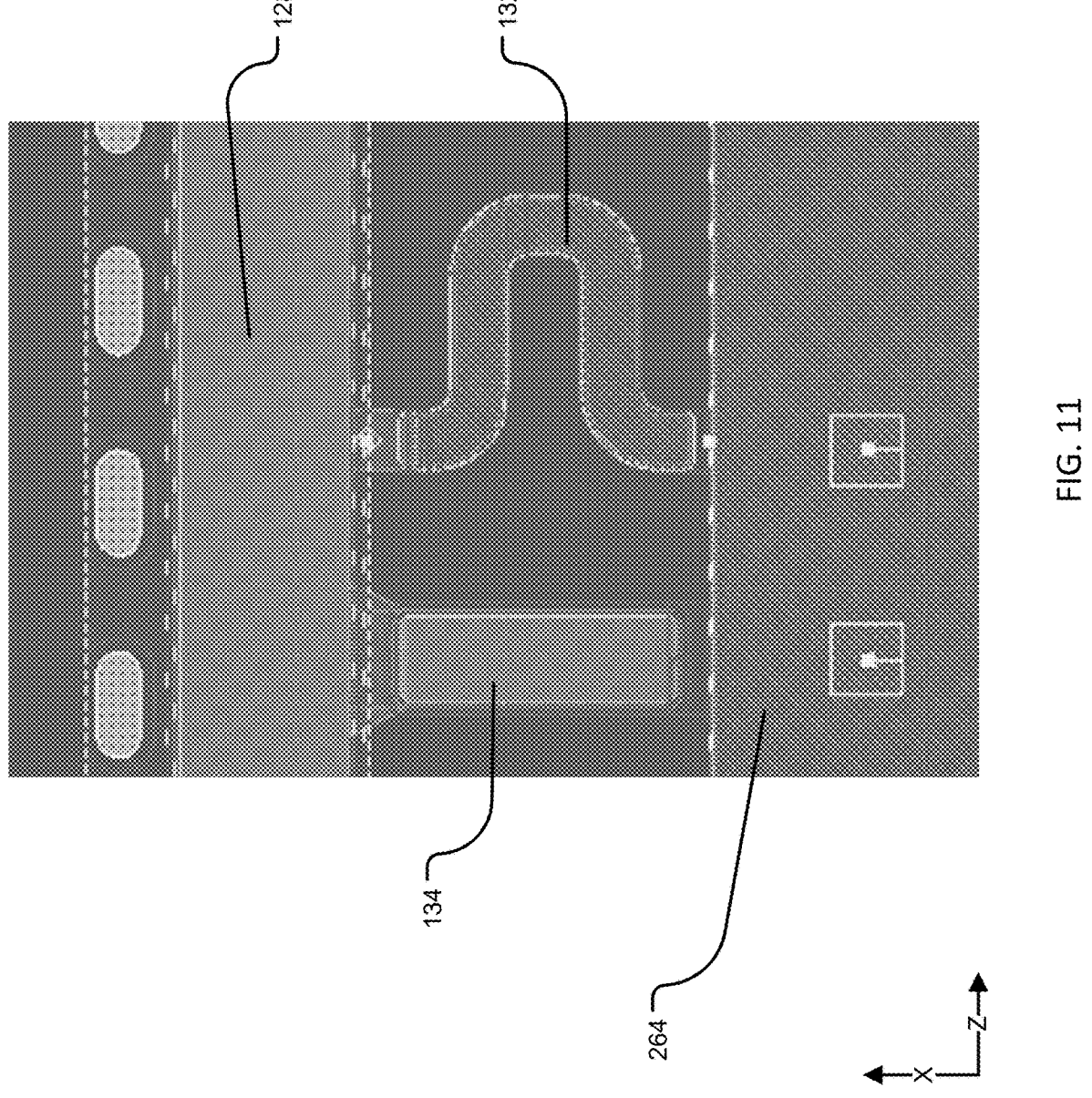
FIG. 11 illustrates an exemplary implementation of the SiC IPD according to aspects of the disclosure.

FIG. 11 illustrates an exemplary implementation of the SiC IPD according to aspects of the disclosure.

The aspects of FIG. 11 may include any other aspects of the disclosure. In particular, FIG. 11 illustrates a layout of the SiC IPD 200 implementing the at least one capacitor 128, the at least one inductor 132, the at least one capacitor 134, and/or the like consistent with the arrangement of the fundamental frequency matching circuit 124 and the higher order harmonic termination circuit 126 illustrated in FIG. 8A.

Figure 12:
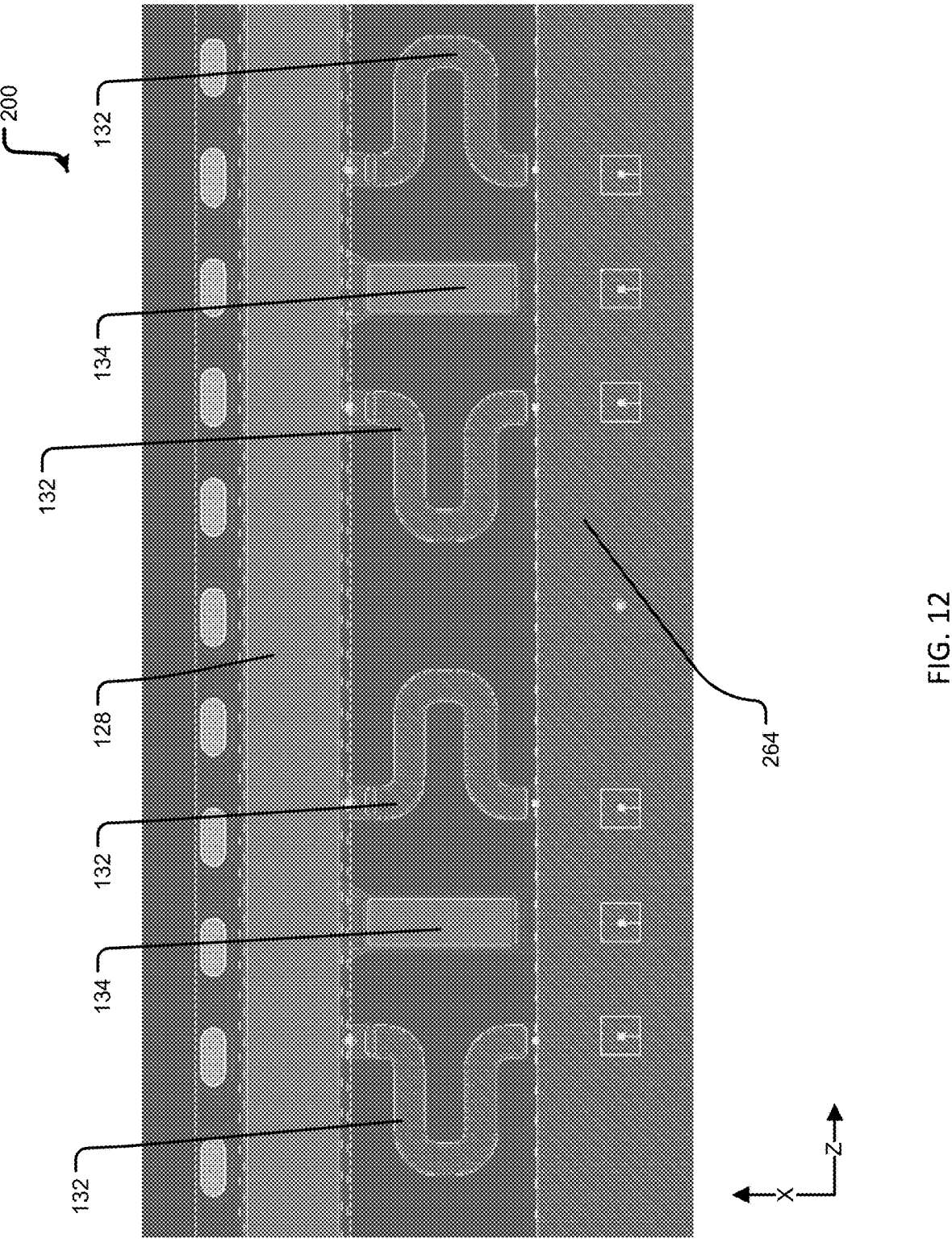
FIG. 12 illustrates an exemplary implementation of the SiC IPD according to aspects of the disclosure.

FIG. 12 illustrates an exemplary implementation of the SiC IPD according to aspects of the disclosure.

The aspects of FIG. 12 may include any other aspects of the disclosure. In particular, FIG. 12 illustrates a layout of the SiC IPD 200 implementing the at least one capacitor

128, the at least one inductor 132, the at least one capacitor 134, and/or the like consistent with the arrangement of the fundamental frequency matching circuit 124 and the higher order harmonic termination circuit 126 illustrated in FIG. 8A. Additionally, the SiC IPD 200 illustrated in FIG. 12 may include a plurality of the at least one capacitor 134 arranged in parallel between the at least one capacitor 128 and the connection pad 264; and the SiC IPD 200 illustrated in FIG. 12 may include a plurality of the at least one inductor 132 arranged in parallel between the at least one capacitor 128 and the connection pad 264.

Figure 13:
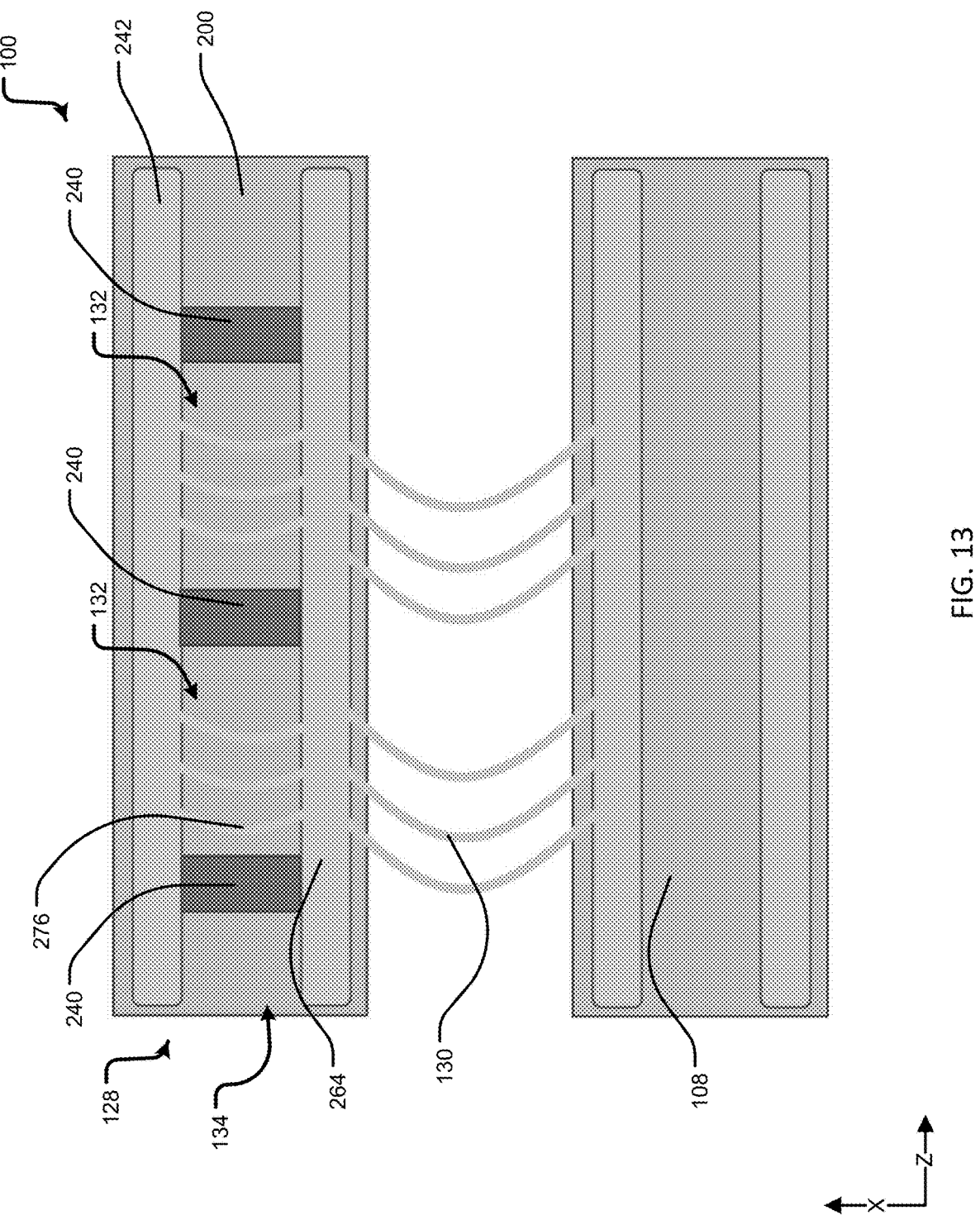
FIG. 13 partially illustrates the amplifier circuit together with an exemplary implementation of the SiC IPD according to aspects of the disclosure.

FIG. 13 partially illustrates the amplifier circuit together with an exemplary implementation of the SiC IPD according to aspects of the disclosure.

The aspects of FIG. 13 may include any other aspects of the disclosure. In particular, FIG. 13 illustrates a layout of an implementation of the SiC IPD 200 implementing the at least one capacitor 128, the at least one inductor 132, the at least one capacitor 134, and/or the like consistent with the arrangement of the fundamental frequency matching circuit 124 and the higher order harmonic termination circuit 126 illustrated in FIG. 8A. Additionally, the SiC IPD 200 illustrated in FIG. 13 may include a plurality of the at least one capacitor 134 arranged in parallel between the at least one capacitor 128 and the connection pad 264; and the SiC IPD 200 illustrated in FIG. 13 may include a plurality of the at least one inductor 132 arranged in parallel between the at least one capacitor 128 and the connection pad 264.

Moreover, the SiC IPD 200 illustrated in FIG. 13 may implement the at least one inductor 132 with bondwires 276 arranged between and connected to the second metallization layer 242 and the connection pad 264. Additionally, the SiC IPD 200 illustrated in FIG. 13 may implement a plurality of the bondwires 276 configured to provide the appropriate inductance as described herein. In aspects, the connection with the bondwires 276 may be by an adhesive, soldering, sintering, eutectic bonding, thermal compression bonding, ultrasonic bonding/welding, a clip component, and/or the like as described herein.

FIG. 13 further illustrates the connection between the SiC IPD 200 and the RF amplifier device 108. In particular, the at least one inductor 130 may be implemented to connect between the connection pad 264, the SiC IPD 200, and a bond pad of the RF amplifier device 108. In this regard, the at least one inductor 130 may be implemented with bondwires and/or other circuits. In aspects, the connection with the at least one inductor 130 may be by an adhesive, soldering, sintering, eutectic bonding, thermal compression bonding, ultrasonic bonding/welding, a clip component, and/or the like as described herein.

In additional aspects, the SiC IPD 200 may include one or more reactive components of the output impedance matching network 116, the output impedance matching network 116, and/or the like. In this regard, the SiC IPD 200 may be configured to implement the capacitors of the output impedance matching network 116, the output impedance matching network 116, and/or the like consistent with the construction of the at least one capacitor 134 of the higher order harmonic termination circuit 126 and/or the at least one capacitor 128 of the fundamental frequency matching circuit 124. Additionally, the SiC IPD 200 may be configured to implement the inductors of the output impedance matching network 116, the output impedance matching network 116, and/or the like consistent with the construction of the at least one inductor 132 of the higher order harmonic termination circuit 126.

Accordingly, the disclosure implements an output high-pass DC blocking capacitor with baseband termination utilizing the at least one capacitor 128 that may be integrated as an IPD in the SiC IPD 200. The higher order harmonic termination circuit 126 may be implemented as a second harmonic frequency match and can also be terminated by a series LC resonator (the at least one inductor 132 and the at least one capacitor 134) connected in parallel with the fundamental shunt implemented by the fundamental frequency matching circuit 124, the at least one inductor 130, the at least one capacitor 128, and/or the like. In this disclosure, a shunt resonator implemented by the fundamental frequency matching circuit 124, the at least one inductor 130, the at least one capacitor 128, and/or the like may be connected in series with the high-pass inductor implementation of the at least one inductor 132. The inductor can be implemented using the low-loss SiC IPD implementation of the SiC IPD 200.

In particular aspects, the at least one inductor 132 may have an inductance of 10 pH-100 pH, 10 pH-20 pH, 20 pH-30 pH, 30 pH-40 pH, 40 pH-50 pH, 50 pH-60 pH, 60 pH-70 pH, 70 pH-80 pH, 80 pH-90 pH, for 90 pH-100 pH. In aspects, the at least one capacitor 134 may have a capacitance of 1 pF-20 pF, 1 pF-2 pF, 2 pF-4 pF, 4 pF-6 pF, 6 pF-8 pF, 8 pF-10 pF, 10 pF-12 pF, 12 pF-14 pF, 14 pF-16 pF, 16 pF-18 pF, or 18 pF-20 pF.

Figure 14:
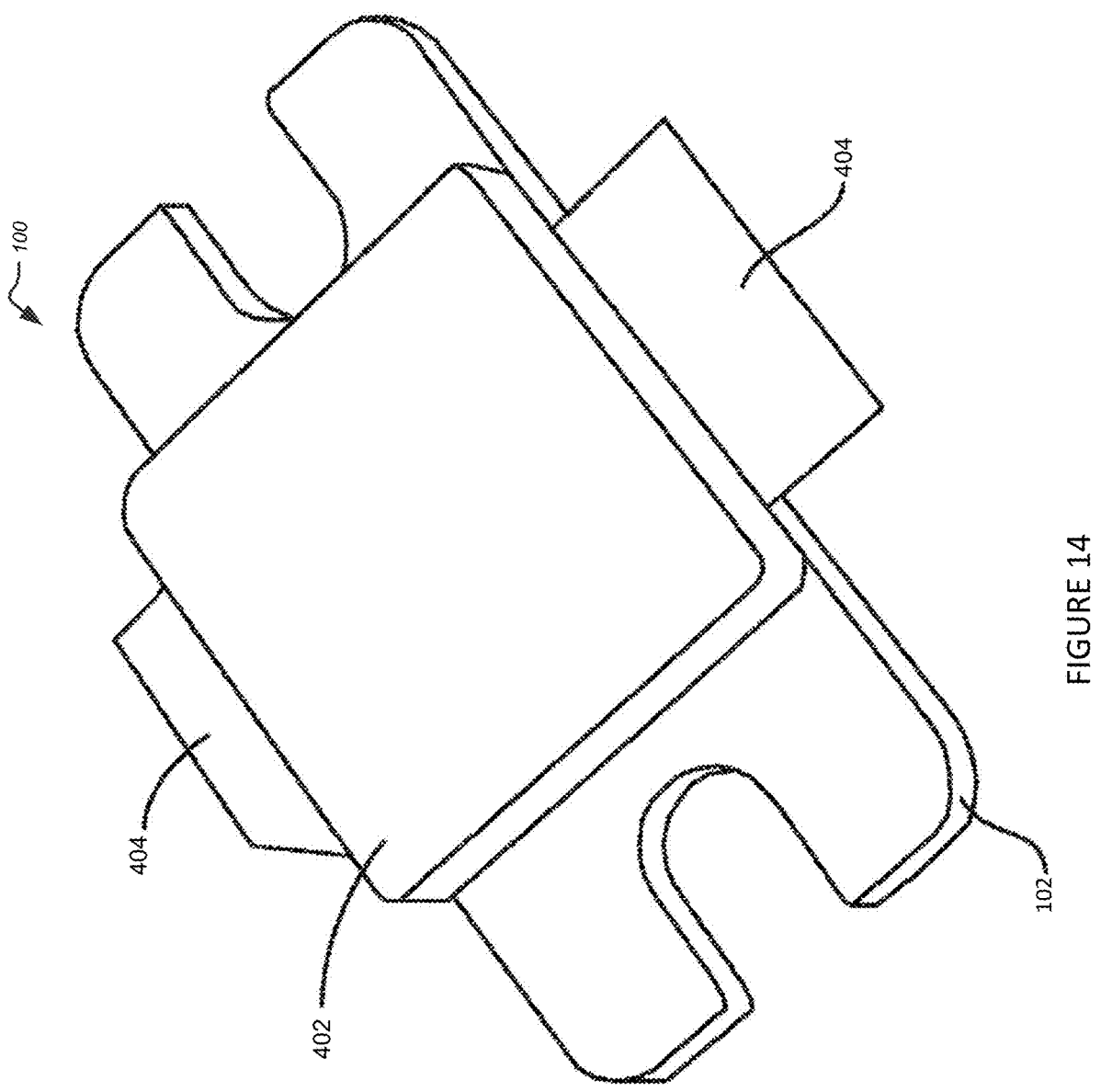
FIG. 14 illustrates a perspective view of a package according to the disclosure.

FIG. 14 illustrates a perspective view of a package according to the disclosure.

Figure 15:
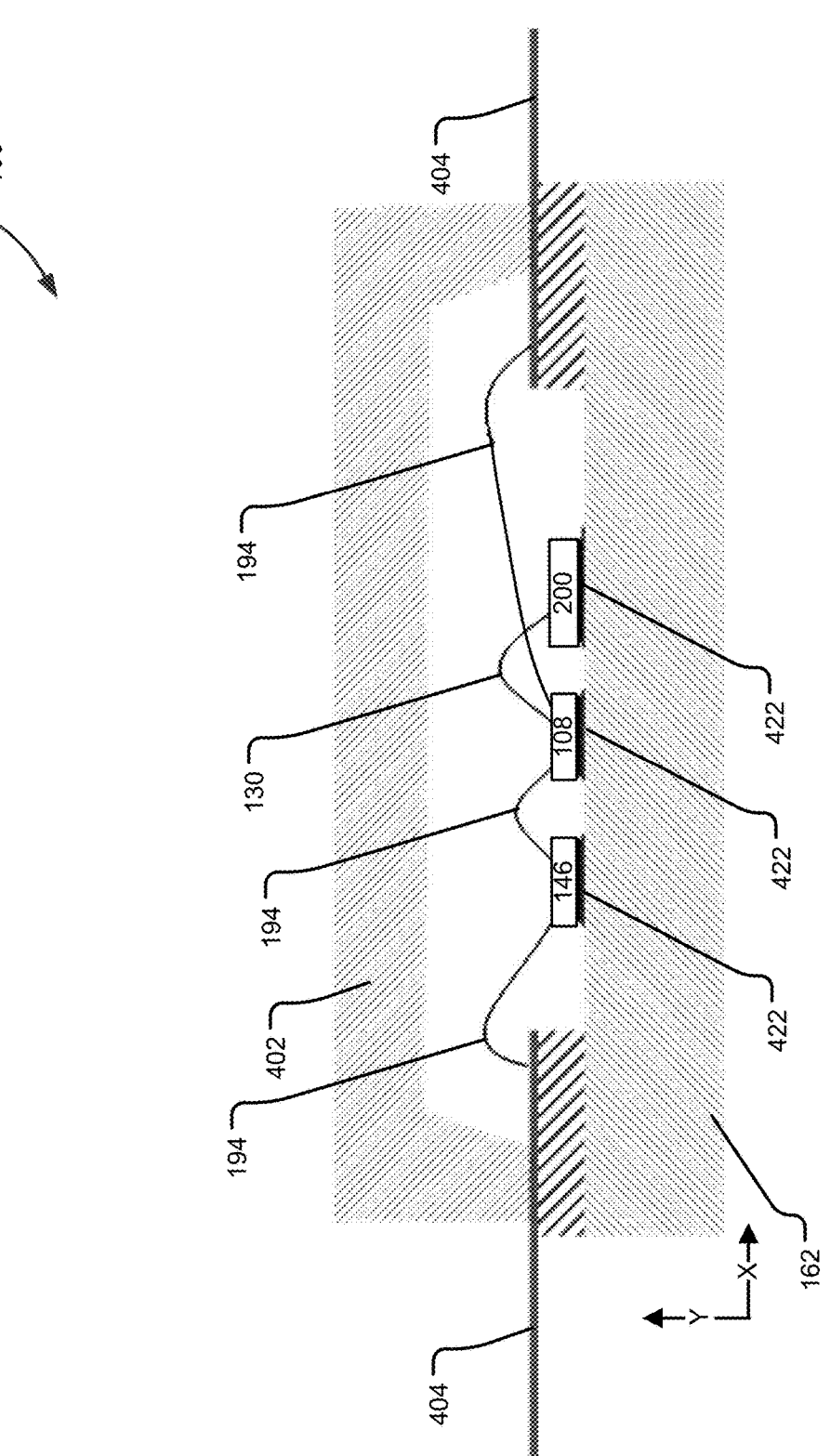
FIG. 15 illustrates a cross-sectional view of the package according to FIG. 14.

FIG. 15 illustrates a cross-sectional view of the package according to FIG. 14.

FIG. 14 and FIG. 15 may include any one or more other features, components, arrangements, and the like as described herein. In particular, FIG. 14 and FIG. 15 illustrate that the amplifier circuit 100 may be implemented as a RF package, a RF amplifier package, a RF power amplifier package, a RF power transistor package, a RF power amplifier transistor package, and/or the like as described herein. The amplifier circuit 100 may include the RF amplifier device 108 and the SiC IPD 200.

The RF amplifier device 108 may include a wide bandgap semiconductor device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration and/or the like.

The amplifier circuit 100 may be implemented to include an open cavity configuration suitable for use with the SiC IPD 200 of the disclosure. In particular, the open cavity configuration may utilize an open cavity package design. In some aspects, the open cavity configuration may include a lid or other enclosure for protecting interconnects, circuit components, the SiC IPD 200, the RF amplifier device 108, and/or the like. The amplifier circuit 100 may include a ceramic body 402 and one or more metal contacts 404. In other aspects, the amplifier circuit 100 may include a plurality of the one or more metal contacts 404; and in aspects the amplifier circuit 100 may include a plurality of parallel implementations of the one or more metal contacts 404 and parallel implementations of the RF amplifier device 108.

Inside the amplifier circuit 100, the RF amplifier device 108 may be attached to a support component 162 via a die attach material 422. One or more interconnects 194 may couple the RF amplifier device 108 to a first one of the one or more metal contacts 404, a second one of the one or more metal contacts 404, the SiC IPD 200, and/or the like. Additionally, inside the amplifier circuit 100, the SiC IPD 200 may be arranged on the support component 162 via a die attach material 422 with the one or more interconnects 194 shown in an exemplary configuration that may connect between the amplifier circuit 100, the SiC IPD 200, and/or the RF amplifier device 108. The support component 162 may dissipate the heat generated by the RF amplifier device 108 and the SiC IPD 200, while simultaneously isolating and protecting the RF amplifier device 108 and the SiC IPD 200 from the outside environment.

Additionally, the RF amplifier device 108 may include one or more transistor dies that may include one or more laterally-diffused metal-oxide semiconductor (LDMOS) transistors, GaN based transistors, Metal Semiconductor Field-Effect transistors (MESFET), Metal Oxide Field Effect Transistors (MOSFET), Junction Field Effect Transistors (JFET), Bipolar Junction Transistors (BJT), Insulated Gate Bipolar Transistors (IGBT), high-electron-mobility transistors (HEMT), Wide Band Gap (WBG) transistors, and/or the like.

The one or more interconnects 194 may be implemented as one or more wires, wire bonds, leads, clips, and/or the like. The one or more interconnects 194 may be include various metal materials including one or more of aluminum, copper, silver, gold, and/or the like. The one or more interconnects 194 may connect to components of the amplifier circuit 100 by an adhesive, soldering, sintering, eutectic bonding, thermal compression bonding, ultrasonic bonding/welding, a clip component, and/or the like as described herein.

The support component 162 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support component 162 may include an insulating material, a dielectric material, and/or the like.

Figure 16:
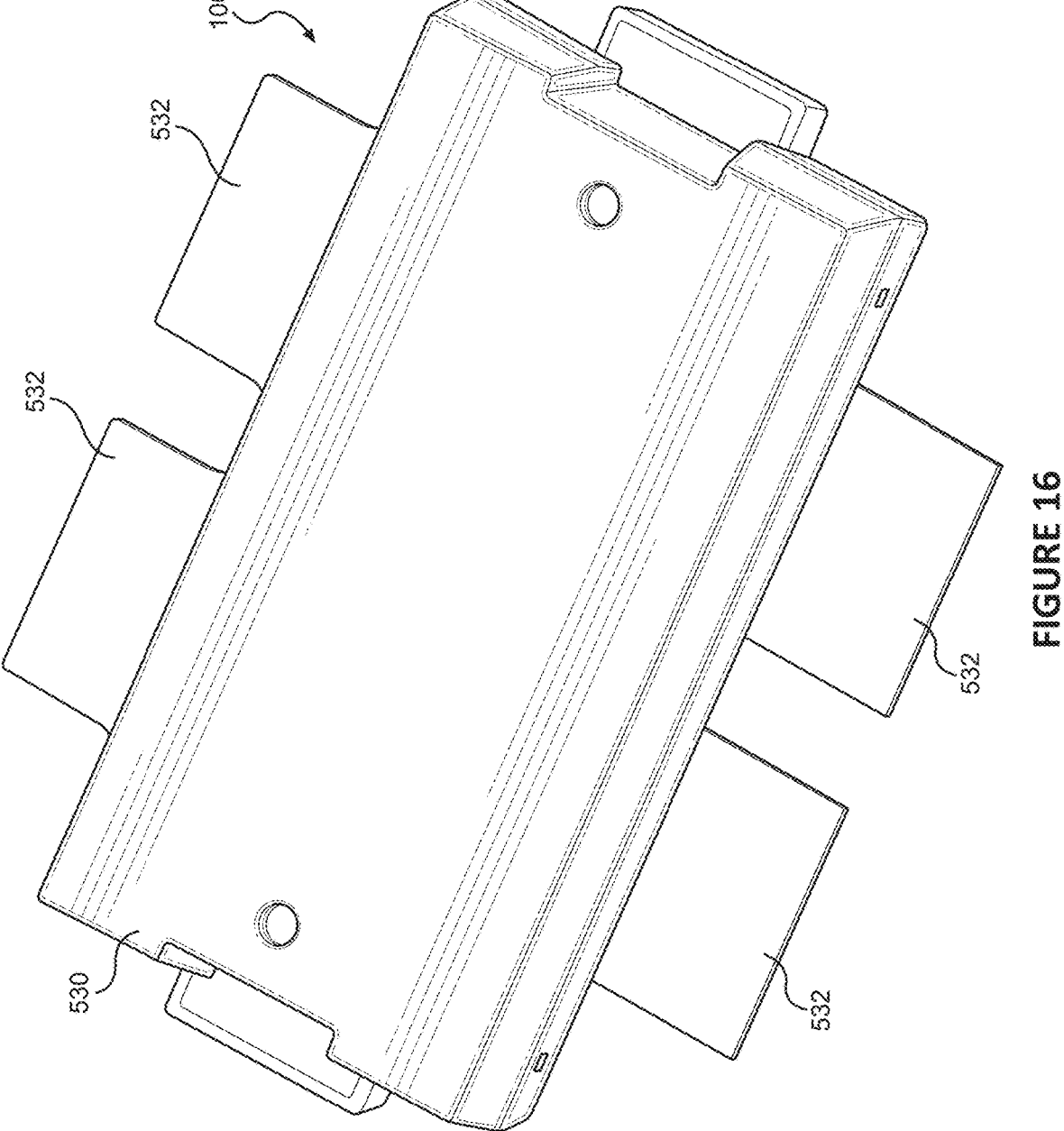
FIG. 16 illustrates a perspective view of a package according to the disclosure.

FIG. 16 illustrates a perspective view of a package according to the disclosure.

Figure 17:
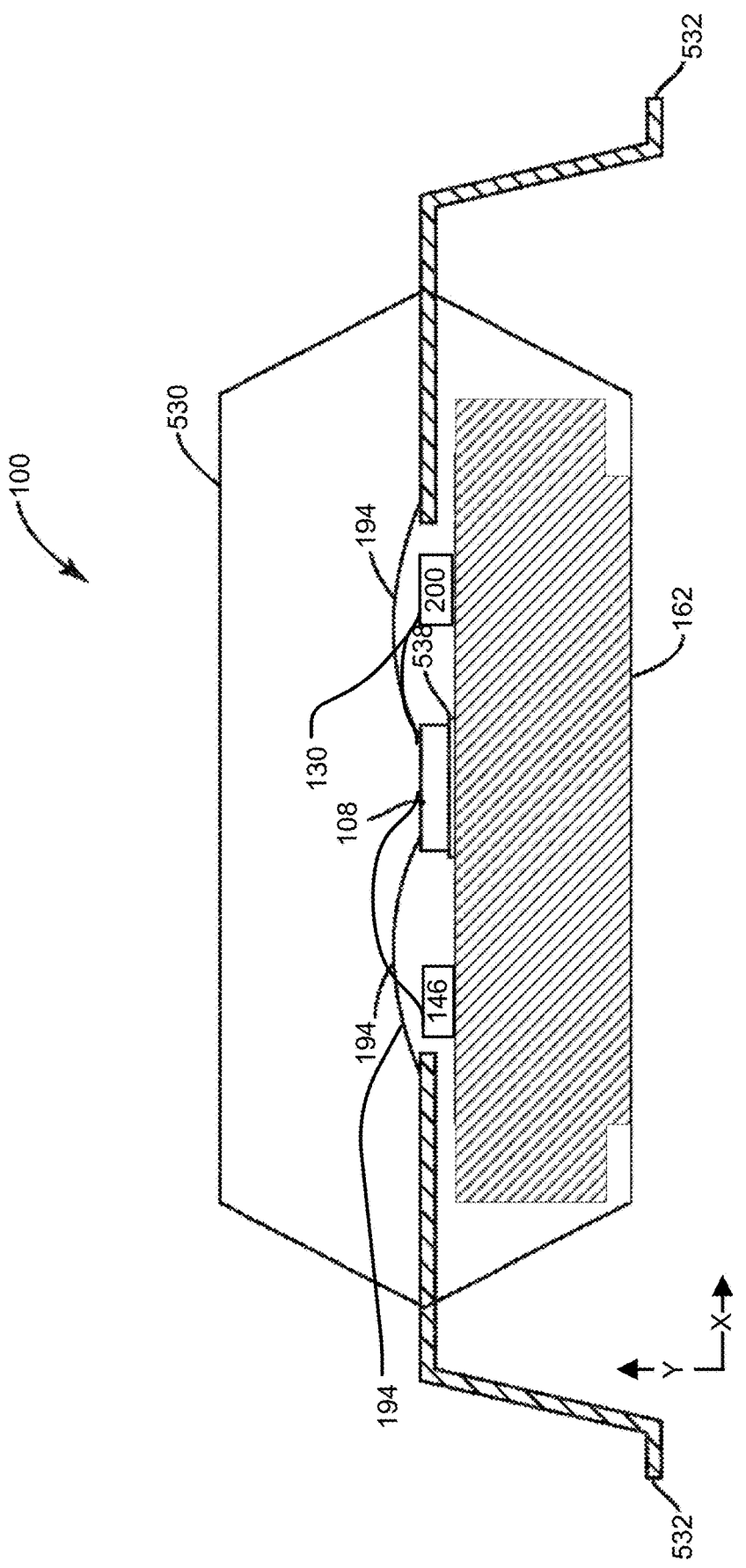
FIG. 17 illustrates a cross-sectional view of the package according to FIG. 16.

FIG. 17 illustrates a cross-sectional view of the package according to FIG. 16.

FIG. 16 and FIG. 17 may include any one or more other features, components, arrangements, and the like as described herein. In particular, FIG. 16 and FIG. 17 show another exemplary implementation of the amplifier circuit 100 that may include any one or more other features, components, arrangements, and the like as described herein. In particular, FIG. 16 and FIG. 17 show the amplifier circuit 100 may be implemented as a RF package, a RF amplifier package, a RF power amplifier package, a RF power transistor package, a RF power amplifier transistor package, and/or the like as described herein. The amplifier circuit 100 may include the RF amplifier device 108, the SiC IPD 200, and/or the like.

Additionally, inside the amplifier circuit 100, the SiC IPD 200 may be arranged on the support component 162 as described herein with the one or more interconnects 194 shown in an exemplary configuration. The amplifier circuit 100 may include an over-mold 530, one or more input/output pins 532, and the support component 162. The over-mold 530 may substantially surround the RF amplifier device 108, which are mounted on the support component 162 using a die attach material 538. The over-mold 530 may be formed of a plastic or a plastic polymer compound, which may be injection molded around the support component 162, the RF amplifier device 108, the SiC IPD 200, and/or the like, thereby providing protection from the outside environment. The RF amplifier device 108 and/or the SiC IPD 200 may be coupled to the one or more input/output pins 532 via the one or more interconnects 194.

In one aspect, the over-mold configuration may substantially surround the RF amplifier device 108, the SiC IPD 200, and/or the like. The over-mold configuration may be formed of a plastic, a mold compound, a plastic compound, a polymer, a polymer compound, a plastic polymer compound, and/or the like. The over-mold configuration may be injection molded, transfer molded, and/or compression molded around the RF amplifier device 108, the SiC IPD 200, and/or the like, thereby providing protection for the SiC IPD 200, the RF amplifier device 108, and other components of the amplifier circuit 100 from the outside environment.

Figure 18:
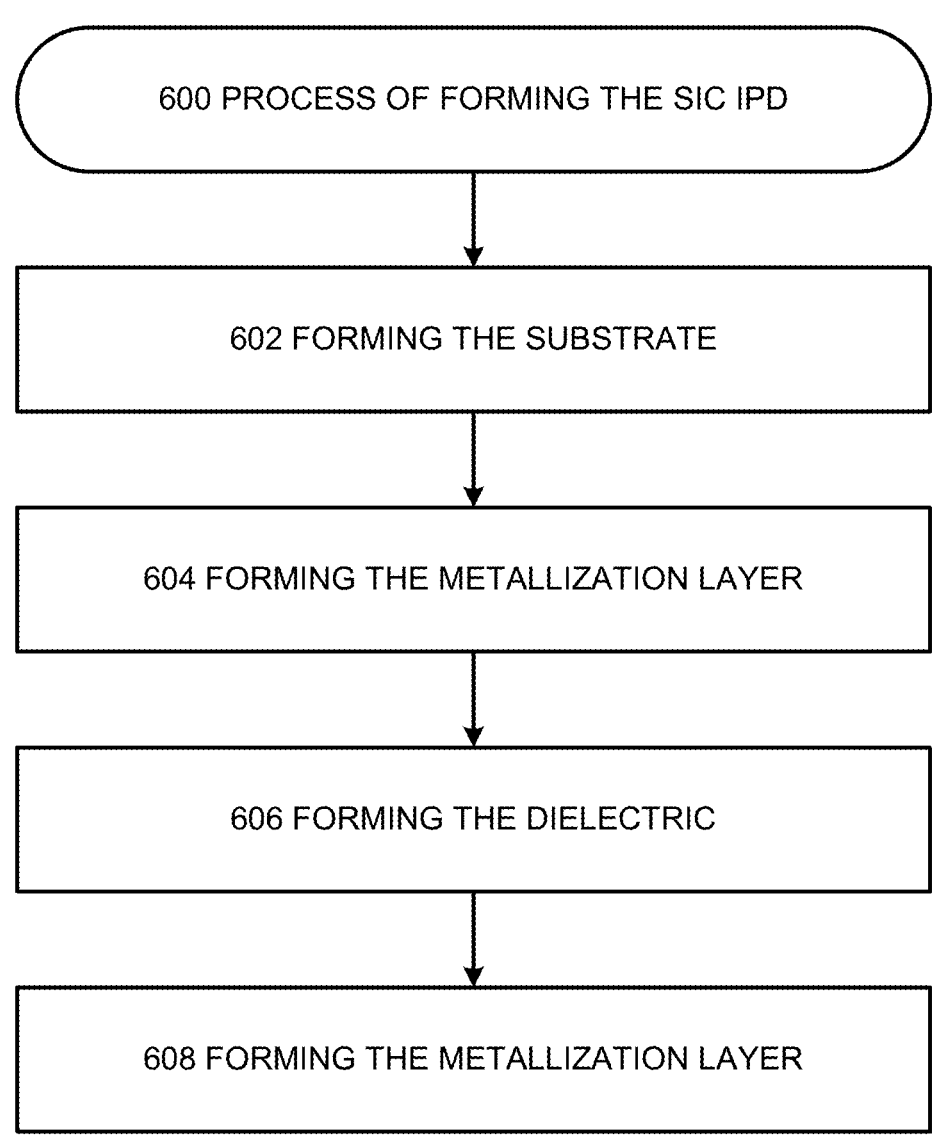
FIG. 18 shows a process of making the SiC IPD according to the disclosure.

FIG. 18 shows a process of making the SiC IPD according to the disclosure.

FIG. 18 may include any one or more other features, components, arrangements, and the like as described herein. In particular, FIG. 18 illustrates a process of forming the SiC IPD 600 that relates to the SiC IPD 200 as described herein. It should be noted that the aspects of the process of the process of forming the SiC IPD 600 may be performed in a different order consistent with the aspects described herein. Additionally, it should be noted that portions of the process of forming the SiC IPD 600 may be performed in a different order consistent with the aspects described herein. Moreover, the process of forming the SiC IPD 600 may be modified to have more or fewer processes consistent with the various aspects disclosed herein.

Initially, the process of forming the SiC IPD 600 may include a process of forming the substrate 602. More specifically, the substrate 204 of the SiC IPD 200 may be constructed, configured, and/or arranged as described herein. Additionally, the process of forming the SiC IPD 600 may include forming electrical connections such as the vias 208 in the substrate 204.

Further, the process of forming the SiC IPD 600 may include forming the metallization layer 604. More specifically, the first bottom metal 266, and the second bottom metal 268 may be constructed, configured, and/or arranged as described herein on at least a portion of the substrate 204. The process of forming the metallization layer 604 may include utilizing one or more manufacturing techniques including print screening for solder paste, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes. In one or more aspects, the first bottom metal 266, and the second bottom metal 268 may be formed in select regions on the substrate 204. In further aspects, the first bottom metal 266, and the second bottom metal 268 may be arranged over the entire surface of the substrate 204 and selectively etched and/or otherwise removed from select locations on the substrate 204.

Additionally, the process of forming the SiC IPD 600 may include forming the dielectric 606. In one or more aspects, the dielectric layer 262 may be formed in select regions on an upper surface of the substrate 204. In further aspects, the dielectric layer 262 may be arranged over the entire surface of the substrate 204 and selectively etched and/or otherwise removed from select locations on the upper surface of the substrate 204.

Further, the process of forming the SiC IPD 600 may include forming the metallization layer 608. More specifically, the first metallization layer 240 and/or the second metallization layer 242 may be constructed, configured, and/or arranged as described herein on at least a portion of the dielectric layer 262. The process of forming the metallization layer 608 may include utilizing one or more MMIC manufacturing processes and/or techniques including sputtering, electroplating with photolithography for pattern definition, and/or like processes. In other aspects, the process of forming the metallization layer 608 may include utilizing manufacturing processes and/or techniques including print screening for solder paste, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes. In one or more aspects, the first metallization layer 240 and/or the second metallization layer 242 may be formed in select regions on the dielectric layer 262. In further aspects, the first metallization layer 240 and/or the second metallization layer 242 may be arranged over the entire surface of the dielectric layer 262 and selectively etched and/or otherwise removed from select locations on the dielectric layer 262.

In some aspects, the process of forming the SiC IPD 600 may include manufacturing to form the SiC IPD 200 in a wafer, a panel, and/or the like. The process of forming the SiC IPD 600 may include cutting the wafer utilizing cutting equipment such as wafer, circuit board, or package sawing equipment to singulate the SiC IPD 200 from the wafer, which may have the advantage that the SiC IPD 200 may be arranged on dicing tape on a ring frame, which can be directly loaded to the Die Attach equipment for subsequent assembly into the amplifier circuit 100. The size of the SiC IPD 200 may be optimized to what subsequent assembly equipment like SMT, Dicing and Die Attach Equipment can handle.

Figure 19:
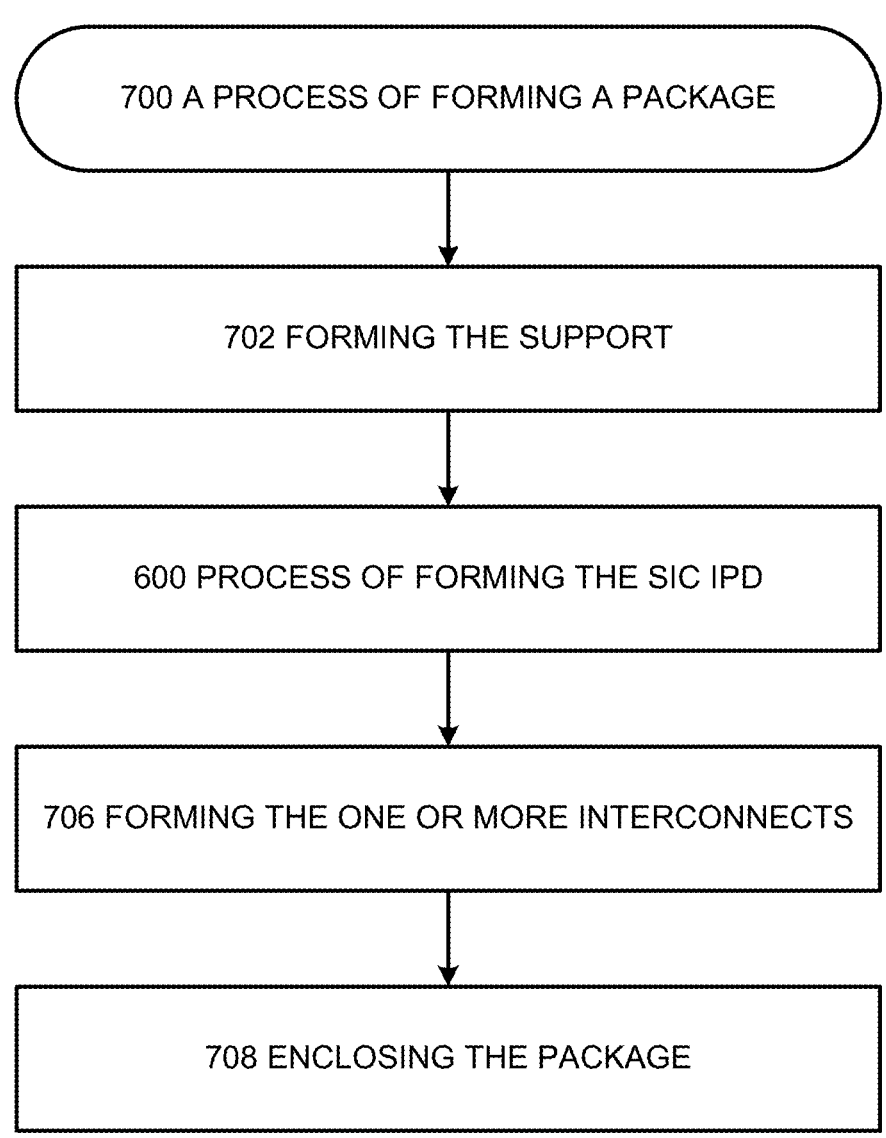
FIG. 19 shows a process of making a package according to the disclosure.

FIG. 19 shows a process of making a package according to the disclosure.

FIG. 19 may include any one or more other features, components, arrangements, and the like as described herein. In particular, FIG. 19 illustrates a process of forming a package 700 that relates to the amplifier circuit 100 as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein.

Initially, the process of forming a package 700 may include a process of forming the support 702. More specifically, the support component 162 may be constructed, configured, and/or arranged as described herein. In one aspect, the process of forming the support 702 may include forming the support component 162 as a printed circuit board, a MMIC, support, a surface, a package support, a package surface, a package support surface, a flange, a heat sink, a common source heat sink, and/or the like.

The process of forming a package 700 may include the process of forming the SiC IPD 600. More specifically, the SiC IPD 200 may be constructed, configured, and/or arranged as described herein with reference to FIG. 18 and the associated description thereof. Thereafter, the process of forming a package 700 may further include attaching the SiC IPD 200 to the support component 162. In this regard, the SiC IPD 200 and/or the substrate 204 may be mounted on the upper surface of the support component 162 by an adhesive, soldering, sintering, eutectic bonding, ultrasonically welding, and/or the like as described herein.

The process of forming a package 700 may include a process of forming the one or more interconnects 706. More specifically, the one or more interconnects 194 may be constructed, configured, and/or arranged as described herein. In one aspect, the process of forming the one or more interconnects 706 may include forming the one or more interconnects 194 by forming one or more wires, leads, vias, edge platings, circuit traces, tracks, and/or the like. In one aspect, the process of forming the one or more interconnects 706 may include connecting the one or more interconnects 706 by an adhesive, soldering, sintering, eutectic bonding, ultrasonic welding, a clip component, and/or the like as described herein.

The process of forming a package 700 may include a process of enclosing the package 708. More specifically, the amplifier circuit 100 may be constructed, configured, and/or arranged as described herein. In one aspect, the process of enclosing the package 708 may include forming an open cavity configuration, an over-mold configuration, or the like.

In one aspect, the process of forming a package 700 may include processing utilizing a surface mount technology (SMT) line. A surface mount technology (SMT) line may utilize numerous processes including solder printing, component placement, solder reflow, and/or the like. additional processes may include a flux cleaning step to remove all flux residues, wire bonding, dicing, mounting to dicing tape, dicing, either mechanical sawing or laser cutting, or a combination of both, and component testing. Additionally, the SiC IPD 200 may be arranged on dicing tape that may then serve as input for the Die Attach equipment.

In particular aspects of the disclosure, the amplifier circuit 100 is implemented such that the higher order harmonic termination circuit 126 may be implemented as a second harmonic termination that is integrated into an in-package IPD (Integrated Passive Device) using a silicon carbide (SiC) substrate implemented as the SiC IPD 200 as described herein. Harmonic termination of RF power devices, such as the RF amplifier device 108, may be essential in the RF power amplifier design either in-package or on PCB board since the RF power amplifier performances are dependent on the harmonic terminations. The in-package termination implemented by the SiC IPD 200 has advantages over the design on PCB board in terms of compactness and PA design convenience. It reduces the RF power devices' performance dependencies on the external harmonic termination or matching. The harmonic terminations are typically implemented using a resonator composed of an inductor(s) and a capacitor(s) where the inductor and the capacitor need to be high quality factor components with low loss for high efficiency operations of the RF power devices. As set forth in this disclosure, the low loss SiC substrate of the SiC IPD 200 may be used to implement the harmonic termination resonator in an integrated form with other impedance matching components integrated as well.

Figure 21:
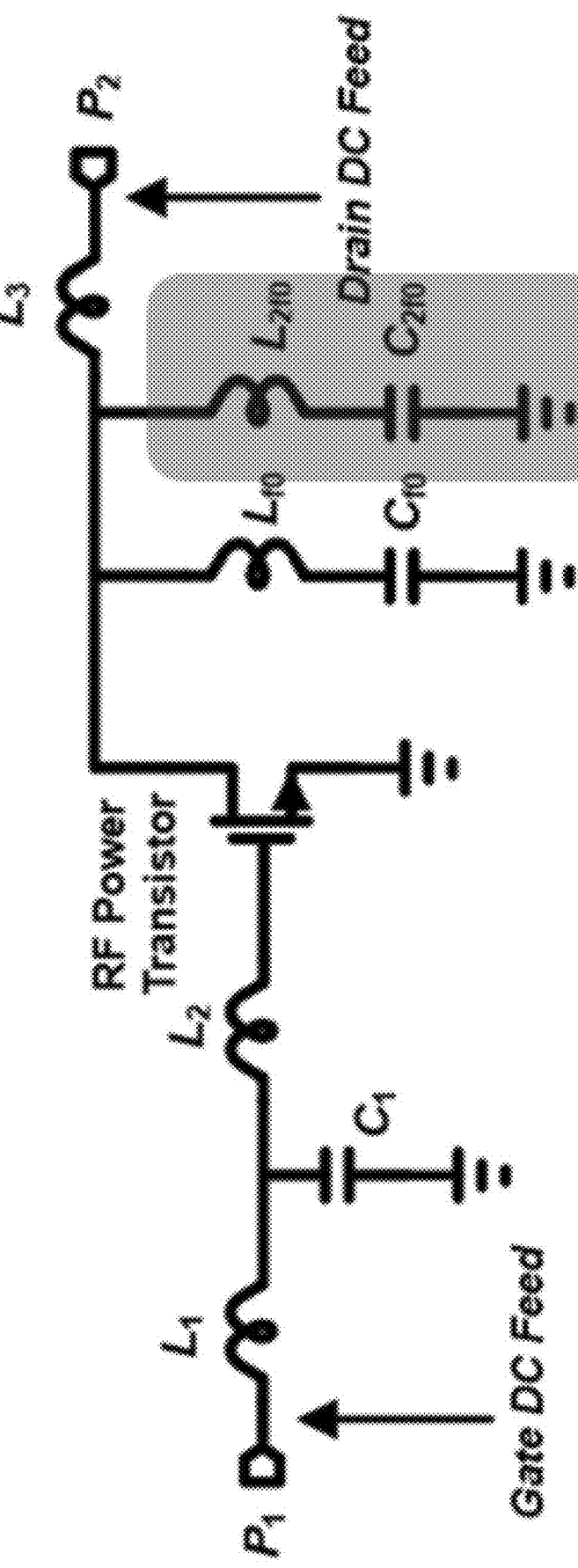
FIG. 21 illustrates a typical RF power device.

In this disclosure, as an alternative of the second harmonic series LC resonator ($L_{2f0}$ $C_{2f0}$) connected in shunt with the fundamental shunt match as illustrated in FIG. 21, a parallel LC resonator, such as the at least one inductor 132 and the at least one capacitor 134 of the higher order harmonic termination circuit 126 is introduced and connected in series with the fundamental shunt inductor, such as the at least one inductor 130, as shown in FIG. 8A.

In this topology, the parallel LC resonator does not take a drain bonding pad space of the RF amplifier device 108 allowing more space for the drain series wires, that may be implemented by the parallel branch 120 and/or the at least one inductor 130 achieving lower series inductance. The second harmonic inductor that may be implemented by the at least one inductor 132 may be implemented using either bonding wires, printed inductors, traces, and/or the like on substrate materials of IPDs, such as the SiC IPD 200 implementing silicon, SiC, in-package PCB, and/or the like. In this disclosure, the low loss SiC substrate of the SiC IPD 200 is used for the printed inductor implementation of the metal inductor layer 272 since the loss may be critical for the high efficiency operation of the RF power devices such as the amplifier circuit 100. Besides the lower loss, the SiC substrate of the SiC IPD 200 also provides high thermal conductivity resulting in lower temperature of the inductor, such as the at least one inductor 132, while conducting a large shunt fundamental matching current enabling the printed inductor implementation of the at least one inductor 132.

As illustrated in FIG. 12, the SiC IPD 200 is shown implemented as an IPD integrating the second harmonic parallel resonators, that may be implemented by the at least one inductor 132 and the at least one capacitor 134, connected in series with the DC blocking capacitor implemented as the at least one capacitor 128. The DC blocking capacitor is connected to the ground or a flange, such as the support component 162 through multiple vias implemented as the vias 208. The capacitor is implemented using a dielectric material (e.g. SiN), such as the dielectric layer 262, between the metal layers on the substrate such as metal 1 (M1) and metal 2 (M2), which may be implemented by the first metallization layer 240, the first bottom metal 266, the second metallization layer 242, the second bottom metal 268, and/or the like.

The higher order harmonic termination circuit 126 implemented as a second harmonic resonator implemented by the at least one inductor 132 and/or the at least one capacitor 134 could be implemented in a group of multiple sub-blocks. The second harmonic resonator capacitors implemented by the at least one capacitor 134 are connected between the DC blocking capacitor implemented by the at least one capacitor 128 and the bonding pad. The second harmonic resonator capacitors are designed to have minimum series parasitic inductance of its own when it is connected between the DC blocking capacitor and the pad. For example, 'X' dimension of the at least one capacitor 134 in FIG. 12 may be designed to be substantially the same as the space between the DC blocking capacitor implemented by the at least one capacitor 128 and the bonding pad implemented by the connection pad 264. Keeping the same resonant frequency, multiple combinations of the inductor and capacitor values exist based on the equation $w^2 = 1/(LC)$, where w is the angular frequency. Therefore, the various examples of the disclosure do not exclude other possible LC combinations. However, the second harmonic resonator inductors implemented by the at least one inductor 132 are designed to have the width wide enough to conduct the fundamental and the second harmonic currents to avoid excessive heat generation. The inductor on the substrate implemented by the at least one inductor 132 can be implemented using either M1 or M2 or both. The components are connected with each other using M1 or M2 or other available metal layers by the SiC IPD 200.

Alternatively, the printed inductor (conductor traces on the SiC substrate of the SiC IPD 200) implemented by the at least one inductor 132 could be replaced with bonding wires bonded on top of the DC blocking capacitor implemented by the at least one capacitor 128 and the pad implemented by the connection pad 264 as shown in FIG. 13. Alternatively, the DC blocking capacitor implemented by the at least one capacitor 128 could have an explicit bonding pad for the bonding wires connecting the DC blocking capacitor to the bonding pad.

The SiC IPD 200 could also include a baseband termination for additional integration. Moreover, aspects of the amplifier circuit 100 and/or the SiC IPD 200 can be used for both input and output pre-matches.

The inductors, such as the at least one inductor 132 could be straight line traces as illustrated in FIG. 7, meander shapes as illustrated in FIG. 6, or spiral shapes to achieve the desired inductance. For example, FIG. 10 illustrates an alternative layout to implement the second harmonic resonator, that may be implemented by the higher order harmonic termination circuit 126, where the at least one inductor 132 are straight line traces.

Figure 20A:
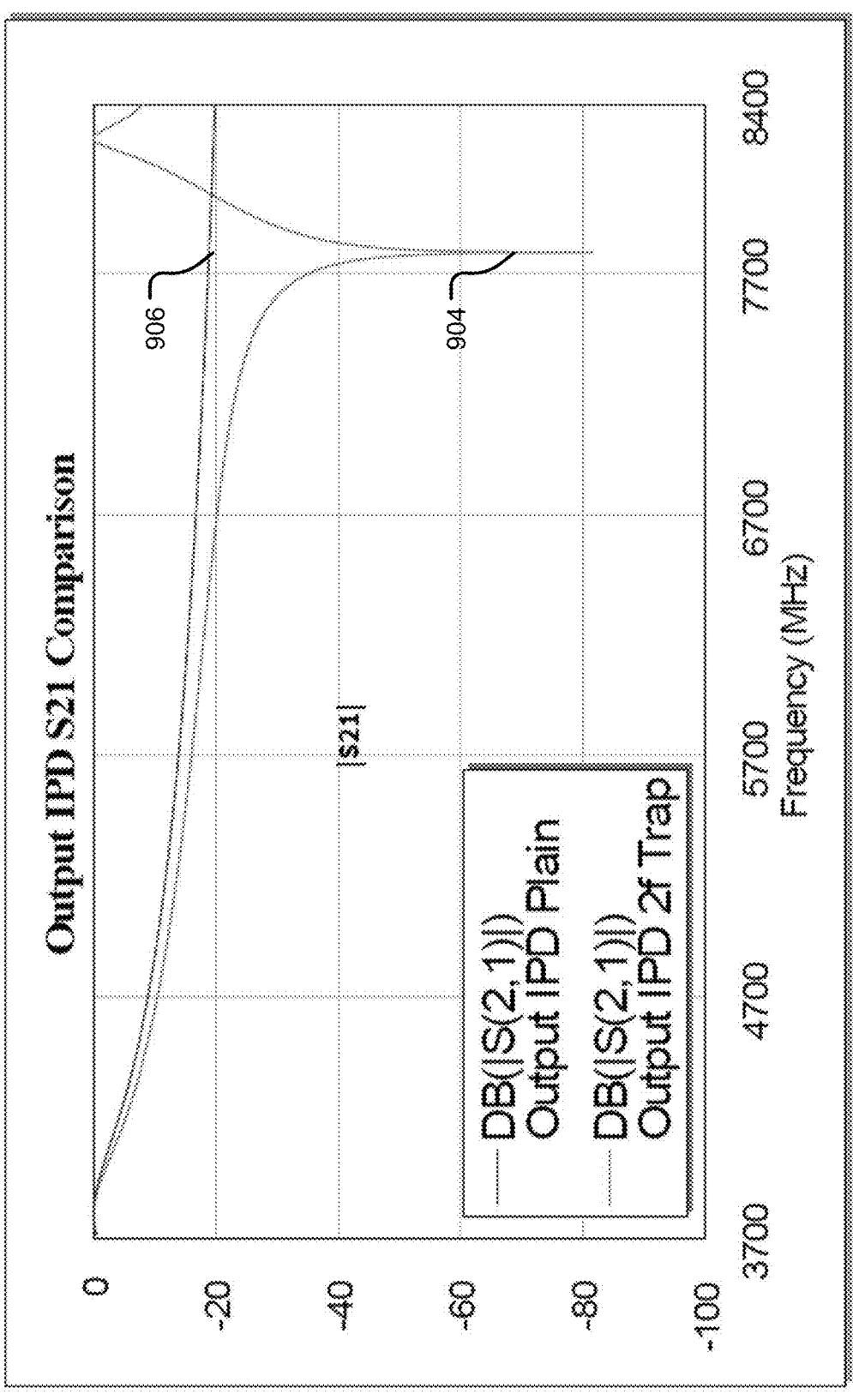
FIG. 20A illustrates an output IPD S21 comparison between the amplifier circuit of the disclosure implementing the SiC IPD and an output of the amplifier circuit of the disclosure without implementation of the SiC IPD.

FIG. 20A illustrates an output IPD S21 comparison between the amplifier circuit of the disclosure implementing the SiC IPD and an output of the amplifier circuit of the disclosure without implementation of the SiC IPD.

In particular, FIG. 20A illustrates an output IPD S21 comparison between the amplifier circuit 100 of the disclosure implementing the SiC IPD 200 and an output of the amplifier circuit 100 of the disclosure without implementation of the SiC IPD 200. FIG. 20A provides values of dB along a vertical axis and values of frequency along the horizontal axis. As illustrated in FIG. 20A, the amplifier circuit 100 of the disclosure implementing the SiC IPD 200 is illustrated by line 904 and an output of the amplifier circuit 100 of the disclosure without implementation of the SiC IPD 200 is illustrated by line 906.

Figure 20B:
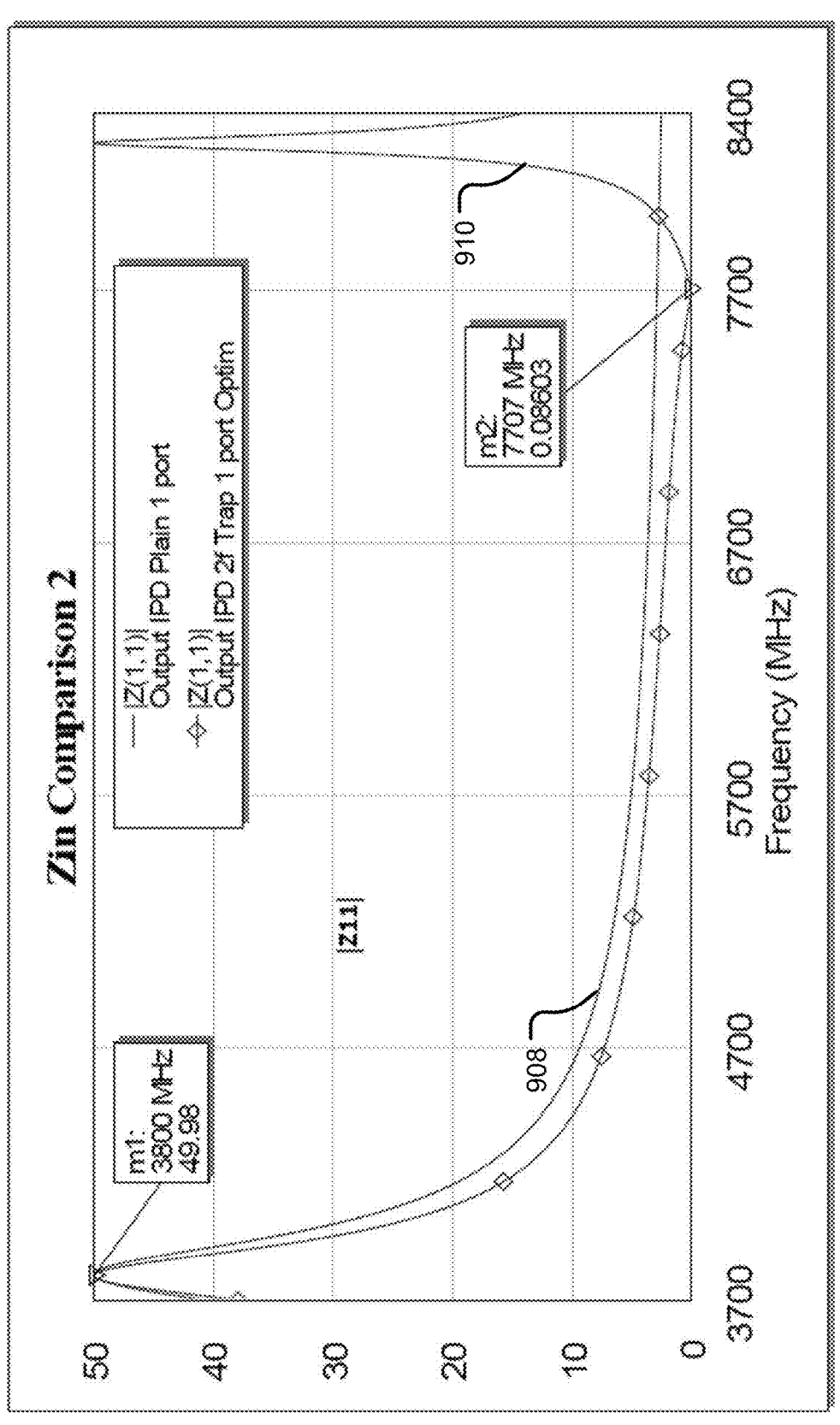
FIG. 20B illustrates a Zin comparison between the amplifier circuit of the disclosure implementing the SiC IPD and an output of the amplifier circuit of the disclosure without implementation of the SiC IPD.

FIG. 20B illustrates a Zin comparison between the amplifier circuit of the disclosure implementing the SiC IPD and an output of the amplifier circuit of the disclosure without implementation of the SiC IPD.

In particular, FIG. 20B illustrates a Zin comparison between the amplifier circuit 100 of the disclosure implementing the SiC IPD 200 and an output of the amplifier circuit 100 of the disclosure without implementation of the SiC IPD 200. FIG. 20B provides values of dB along a vertical axis and values of frequency along the horizontal axis. As illustrated in FIG. 20B, the amplifier circuit 100 of the disclosure implementing the SiC IPD 200 is illustrated by line 908 and an output of the amplifier circuit 100 of the disclosure without implementation of the SiC IPD 200 is illustrated by line 910.

Figure 20C:
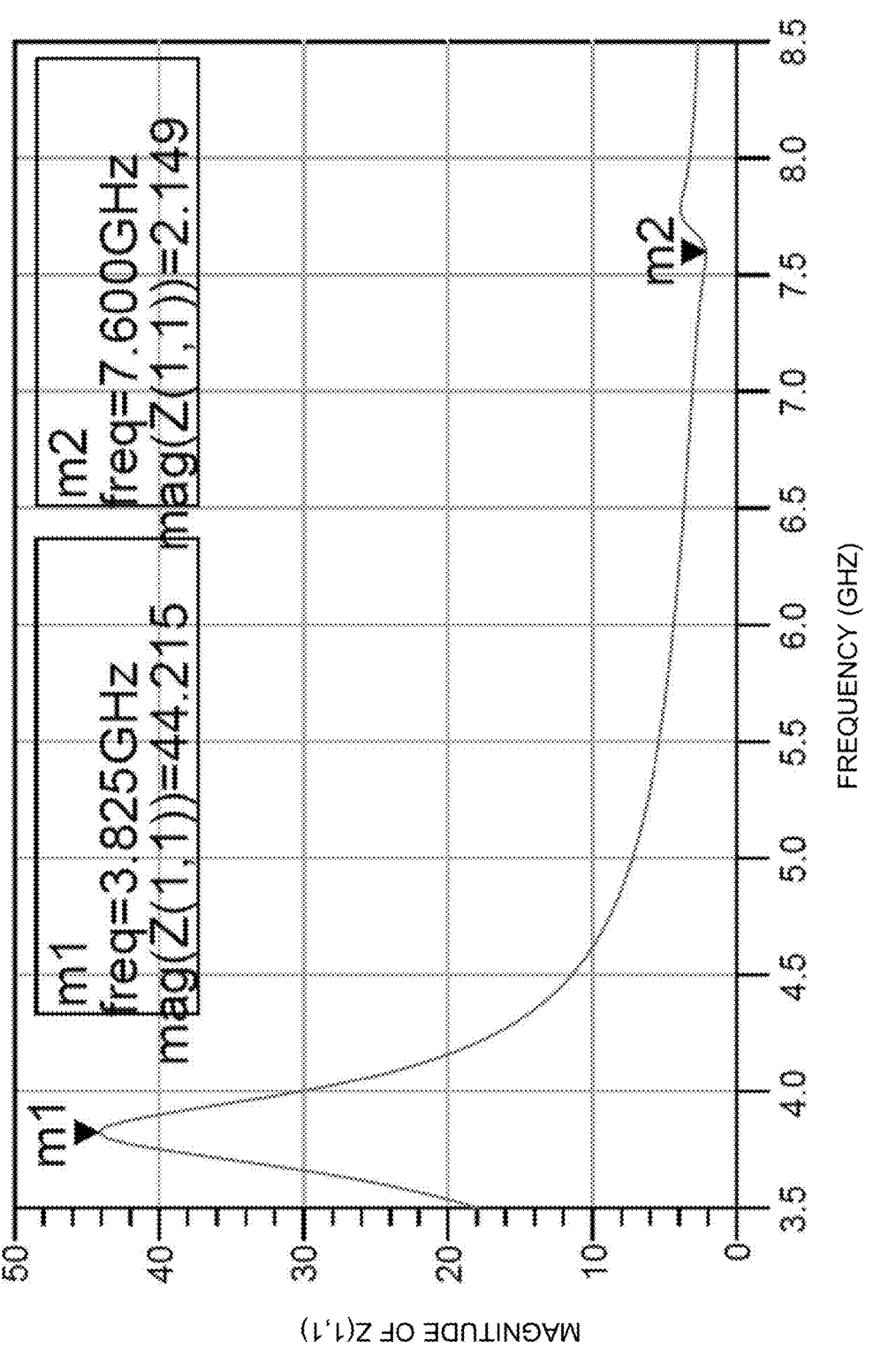
FIG. 20C illustrates electro-magnetic simulated results of the exemplary implementation of the SiC IPD of FIG. 10.

FIG. 20C illustrates electro-magnetic simulated results of the exemplary implementation of the SiC IPD of FIG. 10.

In particular, FIG. 20C illustrates electro-magnetic simulated results of the exemplary implementation of the SiC IPD of FIG. 10 with loss accounted. Whereas FIG. 20B illustrates simulated results based on ideal components without loss. Marker m1 is pointing to the fundamental frequency (3.825 GHz). M2 is pointing to the second harmonic frequency (7.6 GHz). FIG. 20C provides values of magnitude of Z(1,1) along a vertical axis and values of frequency (GHz) along the horizontal axis.

Figure 20D:
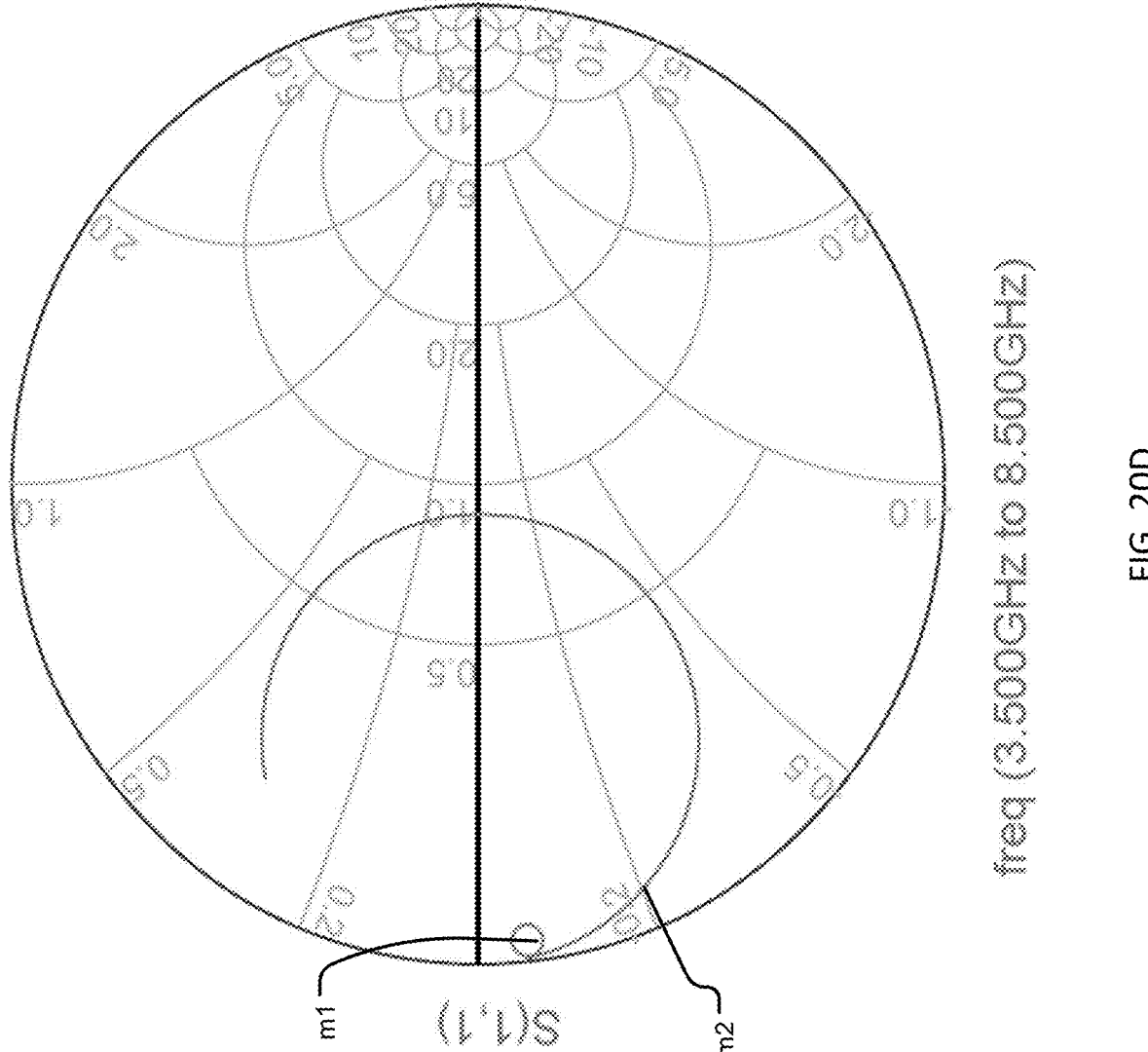
FIG. 20D illustrates a same Zin of the results of FIG. 20C plotted on a Smith chart.

FIG. 20D illustrates a same Zin of the results of FIG. 20C plotted on a Smith chart.

In particular, FIG. 20D illustrates a same Zin of FIG. 20C plotted on a Smith chart as reflection coefficient referred to 50 Ohm.

Figure 20E:
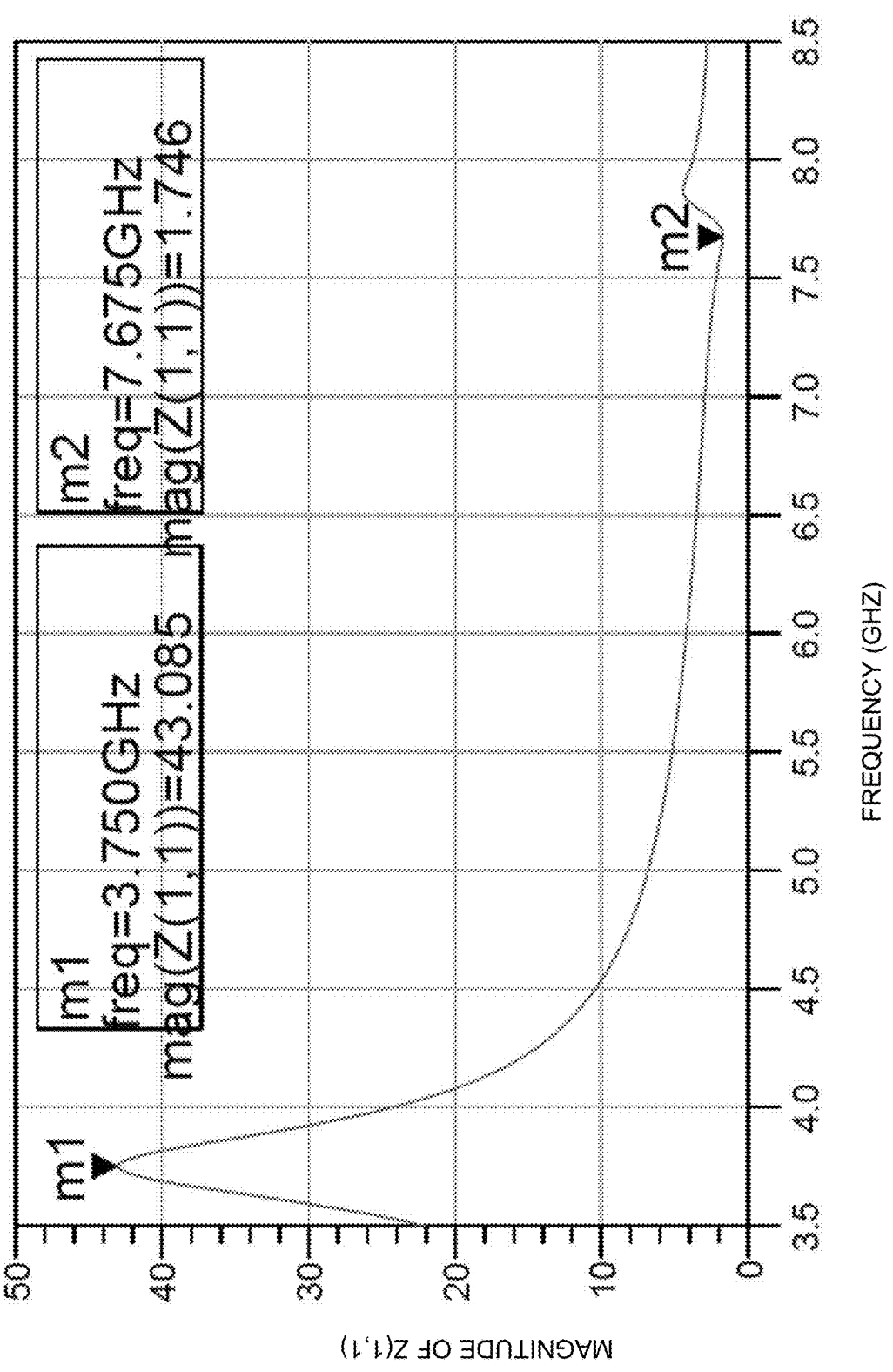
FIG. 20E illustrates electro-magnetic simulated results of the exemplary implementation of the SiC IPD of FIG. 12.

FIG. 20E illustrates electro-magnetic simulated results of the exemplary implementation of the SiC IPD of FIG. 12.

In particular, FIG. 20E illustrates electro-magnetic simulated results of the exemplary implementation of the SiC IPD of FIG. 12 with loss accounted. Whereas FIG. 20B illustrates simulated results based on ideal components without loss. Marker m1 is pointing to the fundamental frequency (3.75 GHz). M2 is pointing to the second harmonic frequency (7.675 GHz). FIG. 20E provides values of magnitude of Z(1,1) along a vertical axis and values of frequency (GHz) along the horizontal axis.

Figure 20F:
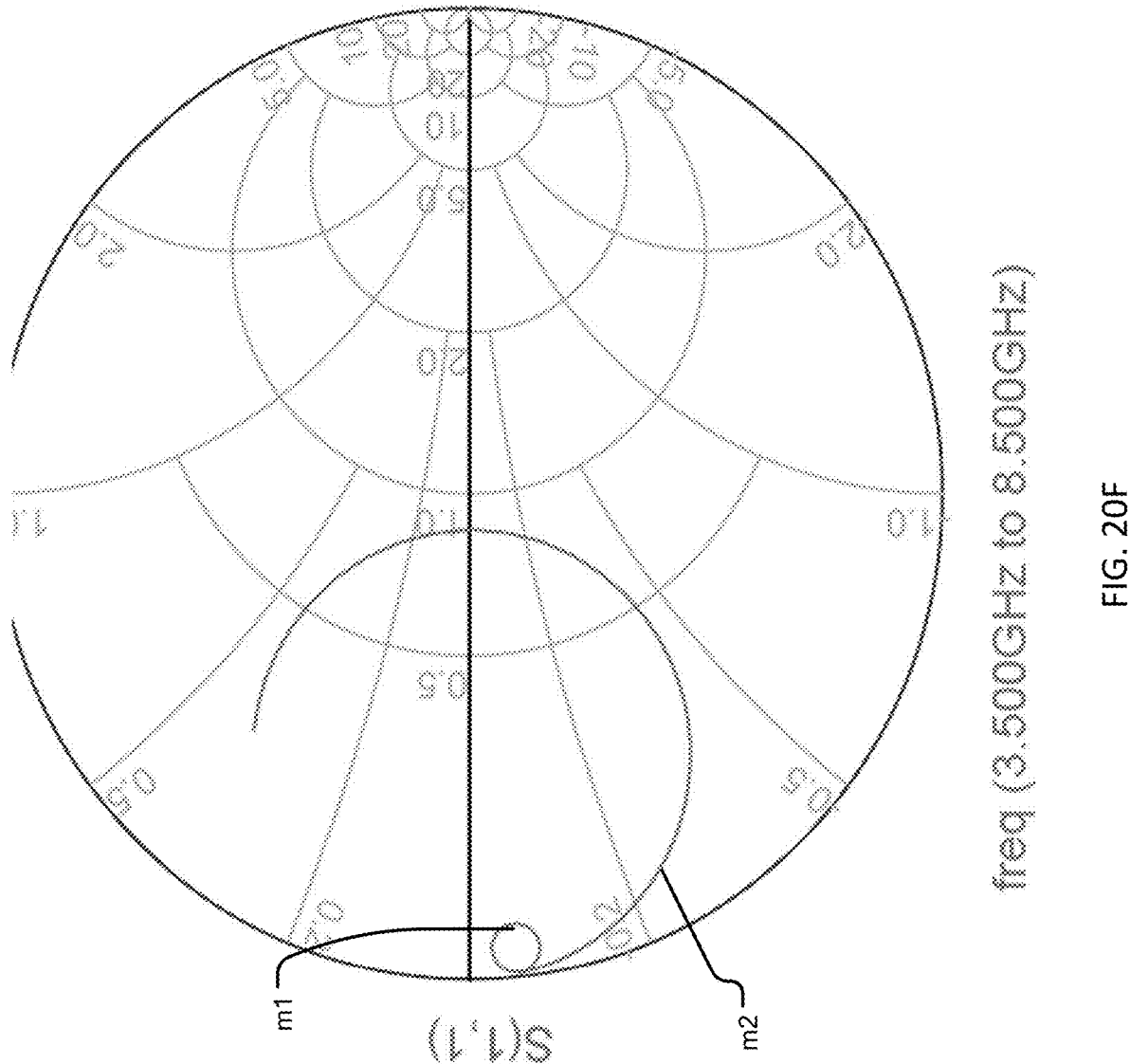
FIG. 20F illustrates a same Zin of the results of FIG. 20E plotted on the Smith chart.

FIG. 20F illustrates a same Zin of the results of FIG. 20E plotted on the Smith chart.

In particular, FIG. 20F illustrates a same Zin of FIG. 20E plotted on the Smith chart as reflection coefficient referred to 50 Ohm.

Figure 20G:
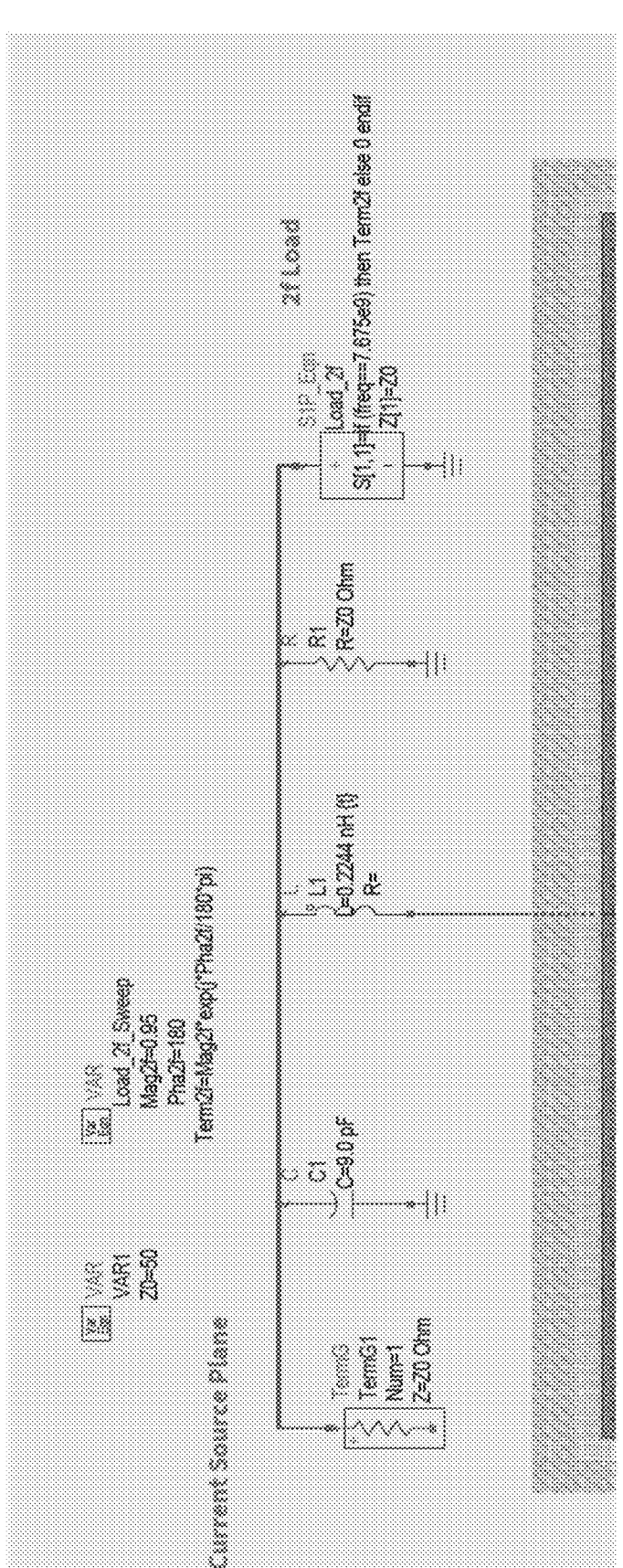
FIG. 20G illustrates a simulation circuit for providing simulation results.

FIG. 20G illustrates a simulation circuit for providing simulation results.

Figure 20H:
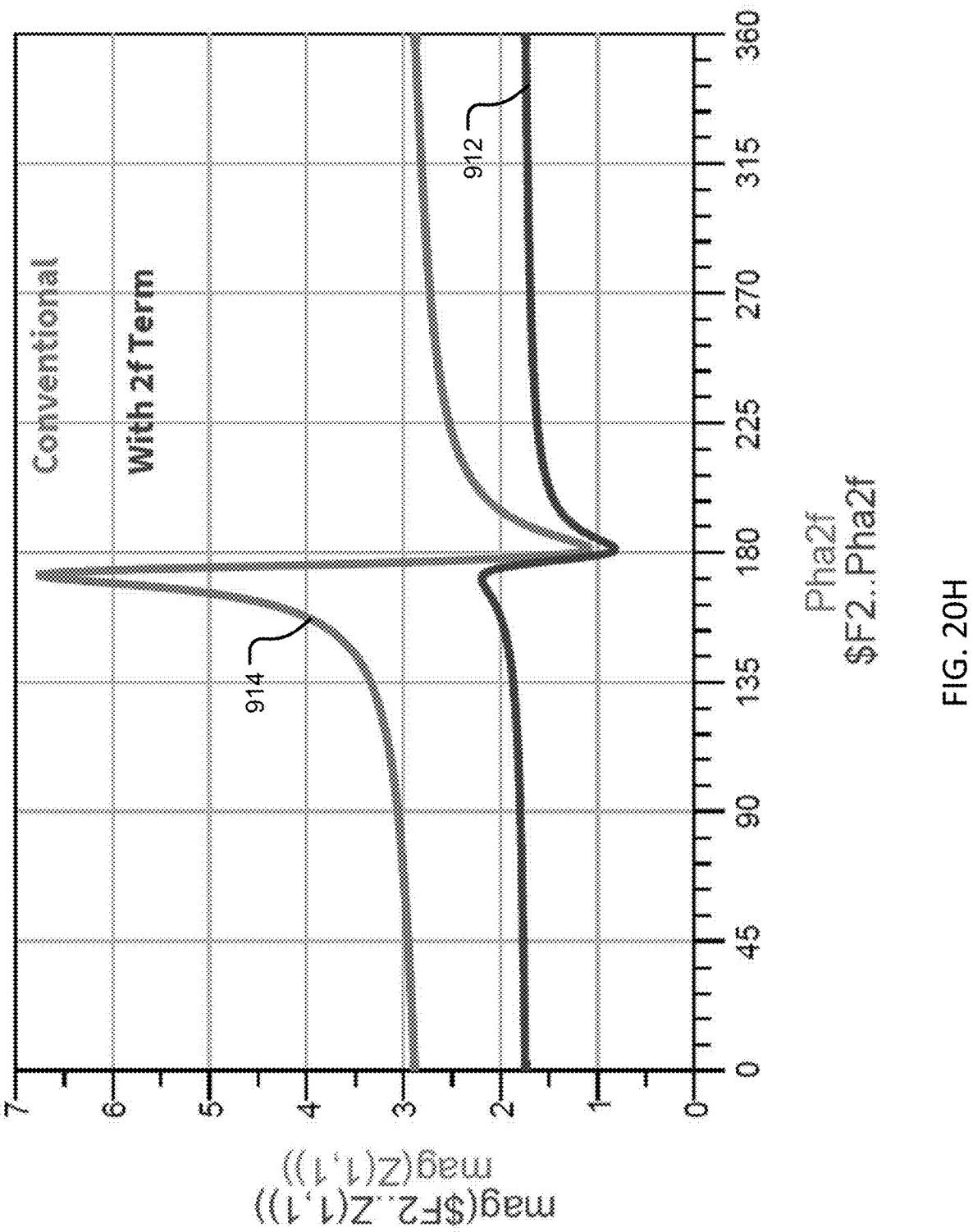
Figure 201:
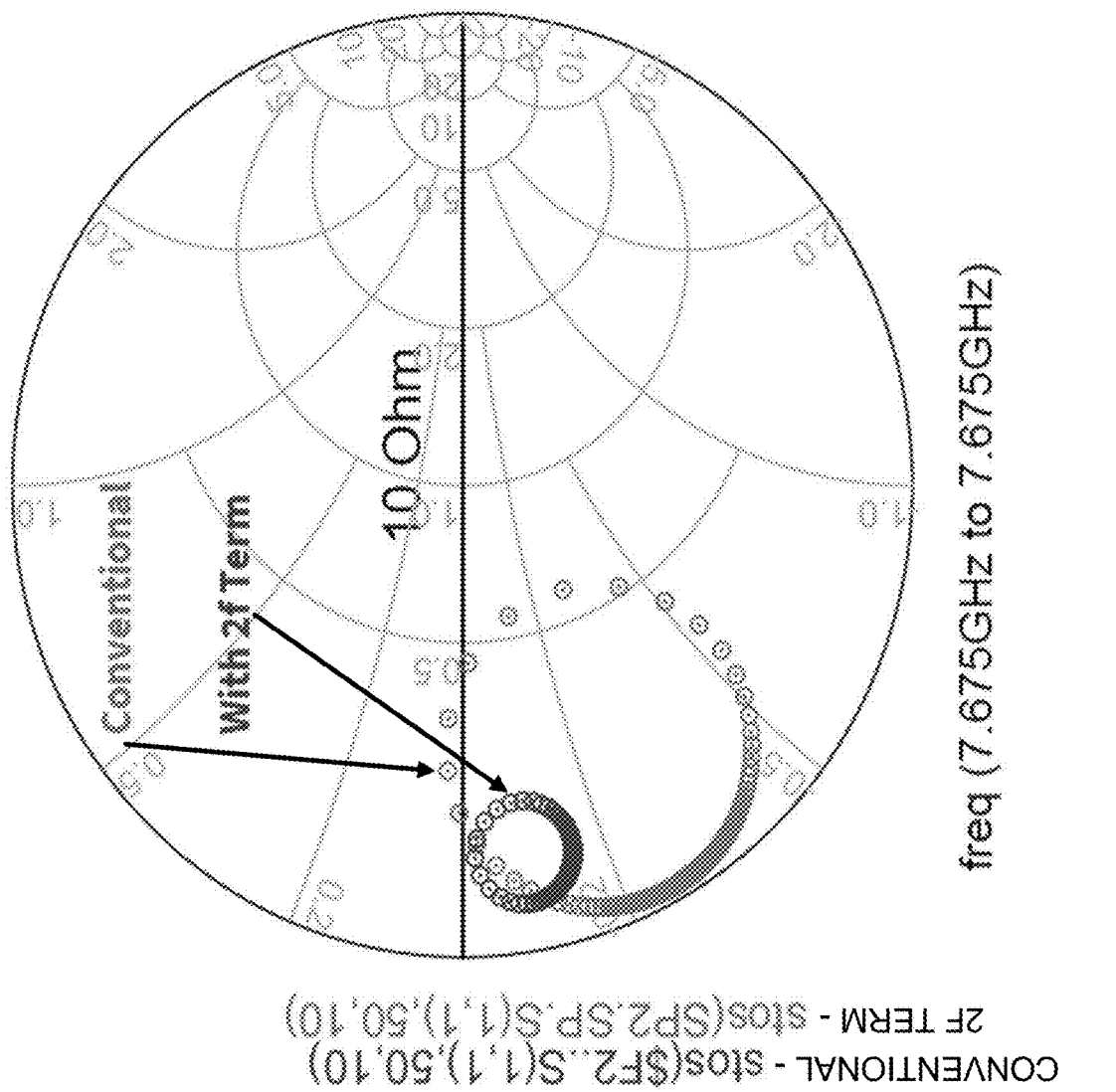

FIG. 20H and FIG. 20I provide simulation results of the circuit according to FIG. 20G.

In particular, FIG. 20H and FIG. 20I compare the effect of the higher order harmonic termination circuit 126 implemented as a second harmonic resonator circuit on a suppression of the second harmonic impedance variation seen from the current source reference plane illustrated in FIG. 20G when the other side is loaded with the varying second harmonic load, e.g., 0.95 reflection coefficient magnitude with swept phases.

More specifically, the simulated results of the circuit illustrated in FIG. 20G include FIG. 20H comparing the impedance variation at the second harmonic frequency of the amplifier circuit 100 with 912 and without 914 implementation of the higher order harmonic termination circuit 126 as a second harmonic frequency termination resonator in terms of the impedance magnitude and the reflection coefficients on the smith chart illustrated FIG. 20I in referring to 10 Ohm, seen from the current source reference plane illustrated in FIG. 20G when the circuit is loaded with the varying second harmonic load, e.g., 0.95 magnitude with swept phases. FIG. 20H provides values of magnitude along a vertical axis and values of phase in degrees along the horizontal axis.

In aspects of the disclosure, the amplifier circuit 100 comprises: the RF amplifier device 108; the output impedance matching network 116; the fundamental frequency matching circuit 124; the higher order harmonic termination circuit 126; and the SiC IPD 200 comprising a silicon carbide (SiC) substrate, wherein the SiC IPD 200 comprises one or more reactive components of the fundamental frequency matching circuit 124 and one or more reactive components of the higher order harmonic termination circuit 126.

In aspects of the disclosure, a process of implementing the amplifier circuit 100 comprises: implementing the RF amplifier device 108; implementing the output impedance matching network 116; implementing the fundamental frequency matching circuit 124; implementing the higher order harmonic termination circuit 126; and configuring the SiC IPD 200 with a silicon carbide (SiC) substrate, wherein the SiC IPD 200 comprises one or more reactive components of the fundamental frequency matching circuit 124 and one or more reactive components of the higher order harmonic termination circuit 126.

In aspects of the disclosure, an integrated circuit comprises: the SiC IPD 200 comprising a silicon carbide (SiC) substrate, wherein the SiC IPD 200 comprises one or more reactive components of the fundamental frequency matching circuit 124 and one or more reactive components of the higher order harmonic termination circuit 126.

Accordingly, the disclosure has provided a device and process for impedance matching that reduces an amount of bonding pad space utilized, reduces losses, increases efficiency, improves thermal performance, and/or the like.

The following are a number of nonlimiting EXAMPLES of aspects of the disclosure. One EXAMPLE includes: EXAMPLE 1. An amplifier circuit that includes: an RF amplifier includes a first terminal, a second terminal, and a reference potential terminal, the RF amplifier configured to amplify an RF signal across an RF frequency range that includes a fundamental RF frequency; an impedance matching network includes: a series branch connected in series between a first port of the amplifier circuit and the first terminal of the RF amplifier; a parallel branch connected in parallel with the first terminal and the reference potential terminal of the RF amplifier, the parallel branch includes a fundamental frequency matching circuit; a higher order harmonic termination circuit electrically connected in series with the fundamental frequency matching circuit; and an integrated passive device (IPD) includes a silicon carbide (SiC) substrate, where the integrated passive device (IPD) includes one or more reactive components of the fundamental frequency matching circuit and one or more reactive components of the higher order harmonic termination circuit.

The above-noted EXAMPLE may further include any one or a combination of more than one of the following EXAMPLES: 2. The amplifier circuit of any EXAMPLE herein, where the one or more reactive components of the fundamental frequency matching circuit includes at least one second capacitor implemented on the silicon carbide (SiC) substrate of the integrated passive device (IPD). 3. The amplifier circuit of any EXAMPLE herein, where the one or more reactive components of the higher order harmonic termination circuit includes at least one first capacitor and at least one first inductor connected in parallel along the parallel branch implemented on the silicon carbide (SiC) substrate of the integrated passive device (IPD). 4. The amplifier circuit of any EXAMPLE herein, where the one or more reactive components of the fundamental frequency matching circuit includes at least one second capacitor implemented on the silicon carbide (SiC) substrate of the integrated passive device (IPD); and where the one or more reactive components of the higher order harmonic termination circuit includes at least one first capacitor and at least one first inductor connected in parallel along the parallel branch implemented on the silicon carbide (SiC) substrate of the integrated passive device (IPD). 5. The amplifier circuit of any EXAMPLE herein, where the fundamental frequency matching circuit includes at least one second capacitor and at least one second inductor connected in series along the parallel branch; and where the one or more reactive components of the fundamental frequency matching circuit includes the at least one second capacitor. 6. The amplifier circuit of any EXAMPLE herein, where the higher order harmonic termination circuit includes a parallel LC resonator connected in series between the at least one second inductor and the at least one second capacitor, the parallel LC resonator includes at least one second capacitor connected in parallel with at least one first inductor; and where the one or more reactive components of the higher order harmonic termination circuit includes the at least one first capacitor and the at least one first inductor. 7. The amplifier circuit of any EXAMPLE herein, where the integrated passive device (IPD) includes: a first top metal; and a first bottom metal, where the integrated passive device (IPD) is configured to form the at least one first capacitor with the first top metal and the first bottom metal have a dielectric layer therebetween. 8. The amplifier circuit of any EXAMPLE herein, where the integrated passive device (IPD) includes: a second top metal; and a second bottom metal, where the integrated passive device (IPD) is configured to form the at least one second capacitor with the second top metal and second first bottom metal have dielectric layer therebetween. 9. The amplifier circuit according to any EXAMPLE herein where the integrated passive device (IPD) includes: a bottom metallization on a bottom of the silicon carbide (SiC) substrate; and at least one via electrically connected to the bottom metallization in the second bottom metal. 10. The amplifier circuit of any EXAMPLE herein, where the integrated passive device (IPD) includes: a first top metal; a first bottom metal; a second top metal; and a second bottom metal, where the integrated passive device (IPD) is configured to form the at least one first capacitor with the first top metal and the first bottom metal have a dielectric layer therebetween; and where the integrated passive device (IPD) is configured to form the at least one second capacitor with the second top metal and second first bottom metal have dielectric layer therebetween.

One EXAMPLE includes: EXAMPLE 11. A process of implementing an amplifier circuit, includes: configuring an RF amplifier with a first terminal, a second terminal, and a reference potential terminal, the RF amplifier configured to amplify an RF signal across an RF frequency range that includes a fundamental RF frequency; configuring an impedance matching network with: a series branch connected in series between a first port of the amplifier circuit and the first terminal of the RF amplifier; connecting a parallel branch in parallel with the first terminal and the reference potential terminal of the RF amplifier, the parallel branch includes a fundamental frequency matching circuit; connecting a higher order harmonic termination circuit electrically in series with the fundamental frequency matching circuit; and configuring an integrated passive device (IPD) with a silicon carbide (SiC) substrate, where the integrated passive device (IPD) includes one or more reactive components of the fundamental frequency matching circuit and one or more reactive components of the higher order harmonic termination circuit.

The above-noted EXAMPLE may further include any one or a combination of more than one of the following EXAMPLES: 12. The process of implementing an amplifier circuit of any EXAMPLE herein, where the one or more reactive components of the fundamental frequency matching circuit includes at least one second capacitor implemented on the silicon carbide (SiC) substrate of the integrated passive device (IPD). 13. The process of implementing an amplifier circuit of any EXAMPLE herein, where the one or more reactive components of the higher order harmonic termination circuit includes at least one first capacitor and at least one first inductor connected in parallel along the parallel branch implemented on the silicon carbide (SiC) substrate of the integrated passive device (IPD). 14. The process of implementing an amplifier circuit of any EXAMPLE herein, where the one or more reactive components of the fundamental frequency matching circuit includes at least one second capacitor implemented on the silicon carbide (SiC) substrate of the integrated passive device (IPD); and where the one or more reactive components of the higher order harmonic termination circuit includes at least one first capacitor and at least one first inductor connected in parallel along the parallel branch implemented on the silicon carbide (SiC) substrate of the integrated passive device (IPD). 15. The process of implementing an amplifier circuit of any EXAMPLE herein, where the fundamental frequency matching circuit includes at least one second capacitor and at least one second inductor connected in series along the parallel branch; and where the one or more reactive components of the fundamental frequency matching circuit includes the at least one second capacitor. 16. The process of implementing an amplifier circuit of any EXAMPLE herein, where the higher order harmonic termination circuit includes a parallel LC resonator connected in series between the at least one second inductor and the at least one second capacitor, the parallel LC resonator includes at least one second capacitor connected in parallel with at least one first inductor; and where the one or more reactive components of the higher order harmonic termination circuit includes the at least one first capacitor and the at least one first inductor. 17. The process of implementing an amplifier circuit of any EXAMPLE herein, includes: configuring the integrated passive device (IPD) with a first top metal; and configuring the integrated passive device (IPD) with a first bottom metal, where the integrated passive device (IPD) is configured to form the at least one first capacitor with the first top metal and the first bottom metal have a dielectric layer therebetween. 18. The process of implementing an amplifier circuit of any EXAMPLE herein, includes: configuring the integrated passive device (IPD) with a second top metal; and configuring the integrated passive device (IPD) with a second bottom metal, where the integrated passive device (IPD) is configured to form the at least one second capacitor with the second top metal and second first bottom metal have dielectric layer therebetween. 19. The process of implementing an amplifier circuit according to any EXAMPLE herein where the integrated passive device (IPD) includes: a bottom metallization on a bottom of the silicon carbide (SiC) substrate; and at least one via electrically connected to the bottom metallization in the second bottom metal. 20. The process of implementing an amplifier circuit of any EXAMPLE herein, further includes: configuring the integrated passive device (IPD) with a first top metal; configuring the integrated passive device (IPD) with a first bottom metal; configuring the integrated passive device (IPD) with a second top metal; and configuring the integrated passive device (IPD) with a second bottom metal, where the integrated passive device (IPD) is configured to form the at least one first capacitor with the first top metal and the first bottom metal have a dielectric layer therebetween; and where the integrated passive device (IPD) is configured to form the at least one second capacitor with the second top metal and second first bottom metal have dielectric layer therebetween.

The following are a number of nonlimiting EXAMPLES of aspects of the disclosure. One EXAMPLE includes: EXAMPLE 21. An amplifier circuit includes: an RF amplifier; an impedance matching network; a fundamental frequency matching circuit; a higher order harmonic termination circuit; and an integrated passive device (IPD) includes a silicon carbide (SiC) substrate, where the integrated passive device (IPD) includes one or more reactive components of the fundamental frequency matching circuit and one or more reactive components of the higher order harmonic termination circuit.

The above-noted EXAMPLE may further include any one or a combination of more than one of the following EXAMPLES: 22. The amplifier circuit of any EXAMPLE herein, where the one or more reactive components of the fundamental frequency matching circuit includes at least one second capacitor implemented on the silicon carbide (SiC) substrate of the integrated passive device (IPD). 23. The amplifier circuit of any EXAMPLE herein, where the one or more reactive components of the higher order harmonic termination circuit includes at least one first capacitor and at least one first inductor connected in parallel along a parallel branch implemented on the silicon carbide (SiC) substrate of the integrated passive device (IPD). 24. The amplifier circuit of any EXAMPLE herein, where the one or more reactive components of the fundamental frequency matching circuit includes at least one second capacitor implemented on the silicon carbide (SiC) substrate of the integrated passive device (IPD); and where the one or more reactive components of the higher order harmonic termination circuit includes at least one first capacitor and at least one first inductor connected in parallel along a parallel branch implemented on the silicon carbide (SiC) substrate of the integrated passive device (IPD). 25. The amplifier circuit of any EXAMPLE herein, where the fundamental frequency matching circuit includes at least one second capacitor and at least one second inductor connected in series along the parallel branch; and where the one or more reactive components of the fundamental frequency matching circuit includes the at least one second capacitor. 26. The amplifier circuit of any EXAMPLE herein, where the higher order harmonic termination circuit includes a parallel LC resonator connected in series between the at least one second inductor and the at least one second capacitor, the parallel LC resonator includes at least one second capacitor connected in parallel with at least one first inductor; and where the one or more reactive components of the higher order harmonic termination circuit includes the at least one first capacitor and the at least one first inductor. 28. The amplifier circuit of any EXAMPLE herein, where the integrated passive device (IPD) includes: a first top metal; and a first bottom metal, where the integrated passive device (IPD) is configured to form the at least one first capacitor with the first top metal and the first bottom metal have a dielectric layer therebetween. 29. The amplifier circuit of any EXAMPLE herein, where the integrated passive device (IPD) includes: a second top metal; and a second bottom metal, where the integrated passive device (IPD) is configured to form the at least one second capacitor with the second top metal and second first bottom metal have dielectric layer therebetween. 30. The amplifier circuit according to any EXAMPLE herein where the integrated passive device (IPD) includes: a bottom metallization on a bottom of the silicon carbide (SiC) substrate; and at least one via electrically connected to the bottom metallization in the second bottom metal. 31. The amplifier circuit of any EXAMPLE herein, where the integrated passive device (IPD) includes: a first top metal; a first bottom metal; a second top metal; and a second bottom metal, where the integrated passive device (IPD) is configured to form the at least one first capacitor with the first top metal and the first bottom metal have a dielectric layer therebetween; and where the integrated passive device (IPD) is configured to form the at least one second capacitor with the second top metal and second first bottom metal have dielectric layer therebetween. 27. The amplifier circuit of any EXAMPLE herein, where the integrated passive device (IPD) is configured to form the at least one first inductor with a metallization arranged on a surface of the silicon carbide (SiC) substrate. 32. The amplifier circuit of any EXAMPLE herein, where the integrated passive device (IPD) additionally includes one or more reactive components of an impedance matching network. 33. The amplifier circuit of any EXAMPLE herein, where: the RF amplifier includes a first terminal, a second terminal, and a reference potential terminal, the RF amplifier configured to amplify an RF signal across an RF frequency range that includes a fundamental RF frequency; the amplifier circuit further includes a parallel branch connected in parallel with the first terminal and the reference potential terminal of the RF amplifier, the parallel branch includes a fundamental frequency matching circuit; the impedance matching network includes: a series branch connected in series between a first port of the amplifier circuit and the first terminal of the RF amplifier; and the higher order harmonic termination circuit electrically connected in series with the fundamental frequency matching circuit.

One EXAMPLE includes: EXAMPLE 34. A process of implementing an amplifier circuit, includes: implementing an RF amplifier; implementing an impedance matching network; implementing fundamental frequency matching circuit; implementing a higher order harmonic termination circuit; and configuring an integrated passive device (IPD) with a silicon carbide (SiC) substrate, where the integrated passive device (IPD) includes one or more reactive components of the fundamental frequency matching circuit and one or more reactive components of the higher order harmonic termination circuit.

The above-noted EXAMPLE may further include any one or a combination of more than one of the following EXAMPLES: 35. The process of implementing an amplifier circuit of any EXAMPLE herein, where the one or more reactive components of the fundamental frequency matching circuit includes at least one second capacitor implemented on the silicon carbide (SiC) substrate of the integrated passive device (IPD). 36. The process of implementing an amplifier circuit of any EXAMPLE herein, where the one or more reactive components of the higher order harmonic termination circuit includes at least one first capacitor and at least one first inductor connected in parallel along a parallel branch implemented on the silicon carbide (SiC) substrate of the integrated passive device (IPD). 37. The process of implementing an amplifier circuit of any EXAMPLE herein, where the integrated passive device (IPD) is configured to form the at least one first inductor with a metallization arranged on a surface of the silicon carbide (SiC) substrate. 38. The process of implementing an amplifier circuit of any EXAMPLE herein, where the one or more reactive components of the fundamental frequency matching circuit includes at least one second capacitor implemented on the silicon carbide (SiC) substrate of the integrated passive device (IPD); and where the one or more reactive components of the higher order harmonic termination circuit includes at least one first capacitor and at least one first inductor connected in parallel along a parallel branch implemented on the silicon carbide (SiC) substrate of the integrated passive device (IPD). 39. The process of implementing an amplifier circuit of any EXAMPLE herein, where the fundamental frequency matching circuit includes at least one second capacitor and at least one second inductor connected in series along the parallel branch; and where the one or more reactive components of the fundamental frequency matching circuit includes the at least one second capacitor. 40. The process of implementing an amplifier circuit of any EXAMPLE herein, where the higher order harmonic termination circuit includes a parallel LC resonator connected in series between the at least one second inductor and the at least one second capacitor, the parallel LC resonator includes at least one second capacitor connected in parallel with at least one first inductor; and where the one or more reactive components of the higher order harmonic termination circuit includes the at least one first capacitor and the at least one first inductor. 41. The process of implementing an amplifier circuit of any EXAMPLE herein, includes: configuring the integrated passive device (IPD) with a first top metal; and configuring the integrated passive device (IPD) with a first bottom metal, where the integrated passive device (IPD) is configured to form the at least one first capacitor with the first top metal and the first bottom metal have a dielectric layer therebetween. 42. The process of implementing an amplifier circuit of any EXAMPLE herein, includes: configuring the integrated passive device (IPD) with a second top metal; and configuring the integrated passive device (IPD) with a second bottom metal, where the integrated passive device (IPD) is configured to form the at least one second capacitor with the second top metal and second first bottom metal have dielectric layer therebetween. 43. The process of implementing an amplifier circuit according to any EXAMPLE herein where the integrated passive device (IPD) includes: a bottom metallization on a bottom of the silicon carbide (SiC) substrate; and at least one via electrically connected to the bottom metallization in the second bottom metal. 45. The process of implementing an amplifier circuit of any EXAMPLE herein, where the integrated passive device (IPD) additionally includes one or more reactive components of the impedance matching network. 44. The process of implementing an amplifier circuit of any EXAMPLE herein, includes: configuring the integrated passive device (IPD) with a first top metal; configuring the integrated passive device (IPD) with a first bottom metal; configuring the integrated passive device (IPD) with a second top metal; and configuring the integrated passive device (IPD) with a second bottom metal, where the integrated passive device (IPD) is configured to form the at least one first capacitor with the first top metal and the first bottom metal have a dielectric layer therebetween; and where the integrated passive device (IPD) is configured to form the at least one second capacitor with the second top metal and second first bottom metal have dielectric layer therebetween. 46. The process of implementing an amplifier circuit of any EXAMPLE herein, includes: configuring the RF amplifier with a first terminal, a second terminal, and a reference potential terminal, the RF amplifier configured to amplify an RF signal across an RF frequency range that includes a fundamental RF frequency; configuring the impedance matching network with: a series branch connected in series between a first port of the amplifier circuit and the first terminal of the RF amplifier; connecting a parallel branch in parallel with the first terminal and the reference potential terminal of the RF amplifier, the parallel branch includes a fundamental frequency matching circuit; and connecting the higher order harmonic termination circuit electrically in series with the fundamental frequency matching circuit.

One EXAMPLE includes: EXAMPLE 47. An integrated circuit includes: an integrated passive device (IPD) includes a silicon carbide (SiC) substrate, where the integrated passive device (IPD) includes one or more reactive components of a fundamental frequency matching circuit and one or more reactive components of a higher order harmonic termination circuit.

The above-noted EXAMPLE may further include any one or a combination of more than one of the following EXAMPLES: 48. The integrated circuit of any EXAMPLE herein, where the one or more reactive components of the fundamental frequency matching circuit includes at least one second capacitor implemented on the silicon carbide (SiC) substrate of the integrated passive device (IPD). 49. The integrated circuit of any EXAMPLE herein, where the one or more reactive components of the higher order harmonic termination circuit includes at least one first capacitor and at least one first inductor connected in parallel along a parallel branch implemented on the silicon carbide (SiC) substrate of the integrated passive device (IPD). 50. The integrated circuit of any EXAMPLE herein, where the one or more reactive components of the fundamental frequency matching circuit includes at least one second capacitor implemented on the silicon carbide (SiC) substrate of the integrated passive device (IPD); and where the one or more reactive components of the higher order harmonic termination circuit includes at least one first capacitor and at least one first inductor connected in parallel along a parallel branch implemented on the silicon carbide (SiC) substrate of the integrated passive device (IPD). 51. The integrated circuit of any EXAMPLE herein, where the fundamental frequency matching circuit includes at least one second capacitor and at least one second inductor connected in series along the parallel branch; and where the one or more reactive components of the fundamental frequency matching circuit includes the at least one second capacitor. 52. The integrated circuit of any EXAMPLE herein, where the higher order harmonic termination circuit includes a parallel LC resonator connected in series between the at least one second inductor and the at least one second capacitor, the parallel LC resonator includes at least one second capacitor connected in parallel with at least one first inductor; and where the one or more reactive components of the higher order harmonic termination circuit includes the at least one first capacitor and the at least one first inductor. 54. The integrated circuit of any EXAMPLE herein, where the integrated passive device (IPD) includes: a first top metal; and a first bottom metal, where the integrated passive device (IPD) is configured to form the at least one first capacitor with the first top metal and the first bottom metal have a dielectric layer therebetween. 55. The integrated circuit of any EXAMPLE herein, where the integrated passive device (IPD) includes: a second top metal; and a second bottom metal, where the integrated passive device (IPD) is configured to form the at least one second capacitor with the second top metal and second first bottom metal have dielectric layer therebetween. 56. The integrated circuit according to any EXAMPLE herein where the integrated passive device (IPD) includes: a bottom metallization on a bottom of the silicon carbide (SiC) substrate; and at least one via electrically connected to the bottom metallization in the second bottom metal. 57. The integrated circuit of any EXAMPLE herein, where the integrated passive device (IPD) includes: a first top metal; a first bottom metal; a second top metal; and a second bottom metal, where the integrated passive device (IPD) is configured to form the at least one first capacitor with the first top metal and the first bottom metal have a dielectric layer therebetween; and where the integrated passive device (IPD) is configured to form the at least one second capacitor with the second top metal and second first bottom metal have dielectric layer therebetween. 53. The integrated circuit of any EXAMPLE herein, where the integrated passive device (IPD) is configured to form the at least one first inductor with a metallization arranged on a surface of the silicon carbide (SiC) substrate. 58. The integrated circuit of any EXAMPLE herein, where the integrated passive device (IPD) additionally includes one or more reactive components of an impedance matching network. 59. An amplifier circuit includes the integrated passive device (IPD) according to any EXAMPLE herein and includes: an RF amplifier includes a first terminal, a second terminal, and a reference potential terminal, the RF amplifier configured to amplify an RF signal across an RF frequency range that includes a fundamental RF frequency; an impedance matching network includes: a series branch connected in series between a first port of the amplifier circuit and the first terminal of the RF amplifier; a parallel branch connected in parallel with the first terminal and the reference potential terminal of the RF amplifier, the parallel branch includes the fundamental frequency matching circuit; and the higher order harmonic termination circuit electrically connected in series with the fundamental frequency matching circuit.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a conductive mass of material by heat and/or pressure. The sintering process may operate without melting the material to the point of liquefaction. The sintering process may include sintering of metallic nano or hybrid powders in pastes or epoxies. The sintering process may include sintering in a vacuum. The sintering process may include sintering with the use of a protective gas.

The eutectic bonding of the disclosure may utilize a eutectic soldering process that may form a eutectic system. The eutectic system may be used between surfaces to be connected. The eutectic bonding may utilize metals that may be alloys and/or intermetallics that transition from solid to liquid state, or from liquid to solid state, at a specific composition and temperature. The eutectic alloys may be deposited by sputtering, evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. An amplifier circuit, comprising:
an RF amplifier;
an impedance matching network;
a fundamental frequency matching circuit;
a higher order harmonic termination circuit; and
an integrated passive device (IPD) comprising a silicon carbide (SiC) substrate,
wherein the integrated passive device (IPD) comprises one or more reactive components of the fundamental frequency matching circuit and one or more reactive components of the higher order harmonic termination circuit.

2. The amplifier circuit of claim 1, wherein the one or more reactive components of the fundamental frequency matching circuit comprise at least one second capacitor implemented on the silicon carbide (SiC) substrate of the integrated passive device (IPD); and
wherein the at least one second capacitor comprises a second top metal and a second bottom metal with a dielectric layer therebetween on an upper surface of the silicon carbide (SiC) substrate of the integrated passive device (IPD).

3. The amplifier circuit of claim 1, wherein the one or more reactive components of the higher order harmonic termination circuit comprise at least one first capacitor and at least one first inductor connected in parallel along a parallel branch implemented on the silicon carbide (SiC) substrate of the integrated passive device (IPD); and
wherein the at least one first capacitor comprises a first top metal and a first bottom metal with a dielectric layer therebetween on an upper surface of the silicon carbide (SiC) substrate of the integrated passive device (IPD).

4. The amplifier circuit of claim 1,
wherein the one or more reactive components of the fundamental frequency matching circuit comprise at least one second capacitor implemented on the silicon carbide (SiC) substrate of the integrated passive device (IPD);
wherein the one or more reactive components of the higher order harmonic termination circuit comprise at least one first capacitor and at least one first inductor connected in parallel along a parallel branch implemented on the silicon carbide (SiC) substrate of the integrated passive device (IPD); and
wherein the at least one first capacitor comprises a first top metal and a first bottom metal with a dielectric layer therebetween on an upper surface of the silicon carbide (SiC) substrate of the integrated passive device (IPD).

5. The amplifier circuit of claim 4,
wherein the fundamental frequency matching circuit comprises the at least one second capacitor and at least one second inductor connected in series along the parallel branch;
wherein the one or more reactive components of the fundamental frequency matching circuit comprise the at least one second capacitor; and wherein the at least one second capacitor comprises a second top metal and a second bottom metal with a dielectric layer therebetween on an upper surface of the silicon carbide (SiC) substrate of the integrated passive device (IPD).

6. The amplifier circuit of claim 5,
wherein the higher order harmonic termination circuit comprises a parallel LC resonator connected in series between the at least one second inductor and the at least one second capacitor, the parallel LC resonator comprising the at least one second capacitor connected in parallel with the at least one first inductor; and
wherein the one or more reactive components of the higher order harmonic termination circuit comprise the at least one first capacitor and the at least one first inductor.

7. The amplifier circuit of claim 5, wherein the integrated passive device (IPD) is configured to form the at least one first inductor with a metallization arranged on a surface of the silicon carbide (SiC) substrate.

8. The amplifier circuit of claim 1, wherein the integrated passive device (IPD) comprises:
a first top metal; and
a first bottom metal,
wherein the integrated passive device (IPD) is configured to form at least one first capacitor with the first top metal and the first bottom metal having a dielectric layer therebetween.

9. The amplifier circuit of claim 1, wherein the integrated passive device (IPD) comprises:
a second top metal; and
a second bottom metal,
wherein the integrated passive device (IPD) is configured to form at least one second capacitor with the second top metal and the second bottom metal having a dielectric layer therebetween.

10. The amplifier circuit according to claim 9 wherein the integrated passive device (IPD) comprises:
a bottom metallization on a bottom of the silicon carbide (SiC) substrate; and
at least one via electrically connected to the bottom metallization and the second bottom metal.

11. The amplifier circuit of claim 1, wherein the integrated passive device (IPD) comprises:
a first top metal;
a first bottom metal;
a second top metal; and
a second bottom metal,
wherein the integrated passive device (IPD) is configured to form at least one first capacitor with the first top metal and the first bottom metal having a dielectric layer therebetween; and
wherein the integrated passive device (IPD) is configured to form at least one second capacitor with the second top metal and the second bottom metal having a dielectric layer therebetween.

12. The amplifier circuit of claim 1, wherein the integrated passive device (IPD) additionally comprises one or more reactive components of an impedance matching network on an upper surface of the silicon carbide (SiC) substrate of the integrated passive device (IPD).

13. The amplifier circuit of claim 1, wherein:
the RF amplifier comprises a first terminal, a second terminal, and a reference potential terminal, the RF amplifier configured to amplify an RF signal across an RF frequency range that includes a fundamental RF frequency;

the amplifier circuit further comprises a parallel branch connected in parallel with the first terminal and the reference potential terminal of the RF amplifier, the parallel branch comprising a fundamental frequency matching circuit;

the impedance matching network comprises: a series branch connected in series between a first port of the amplifier circuit and the first terminal of the RF amplifier; and the higher order harmonic termination circuit electrically connected in series with the fundamental frequency matching circuit.

14. A process of implementing an amplifier circuit, comprising:

implementing an RF amplifier;

implementing an impedance matching network;

implementing fundamental frequency matching circuit;

implementing a higher order harmonic termination circuit; and configuring an integrated passive device (IPD) with a silicon carbide (SiC) substrate, wherein the integrated passive device (IPD) comprises one or more reactive components of the fundamental frequency matching circuit and one or more reactive components of the higher order harmonic termination circuit.

15. An integrated circuit, comprising:

an integrated passive device (IPD) comprising a silicon carbide (SiC) substrate, wherein the integrated passive device (IPD) comprises one or more reactive components of a fundamental frequency matching circuit and one or more reactive components of a higher order harmonic termination circuit.

16. The integrated circuit of claim 15, wherein the one or more reactive components of the fundamental frequency matching circuit comprise at least one second capacitor implemented on the silicon carbide (SiC) substrate of the integrated passive device (IPD); and wherein the at least one second capacitor comprises a second top metal and a second bottom metal with a dielectric layer therebetween on an upper surface of the silicon carbide (SiC) substrate of the integrated passive device (IPD).

17. The integrated circuit of claim 16, wherein the one or more reactive components of the higher order harmonic termination circuit comprise at least one first capacitor and at least one first inductor connected in parallel along a parallel branch implemented on the silicon carbide (SiC) substrate of the integrated passive device (IPD); and wherein the at least one first capacitor comprises a first top metal and a first bottom metal with a dielectric layer therebetween on an upper surface of the silicon carbide (SiC) substrate of the integrated passive device (IPD).

18. The integrated circuit of claim 15, wherein the one or more reactive components of the fundamental frequency matching circuit comprise at least one second capacitor implemented on the silicon carbide (SiC) substrate of the integrated passive device (IPD);

wherein the one or more reactive components of the higher order harmonic termination circuit comprise at least one first capacitor and at least one first inductor connected in parallel along a parallel branch implemented on the silicon carbide (SiC) substrate of the integrated passive device (IPD); and wherein the at least one first capacitor comprises a first top metal and a first bottom metal with a dielectric layer therebetween on an upper surface of the silicon carbide (SiC) substrate of the integrated passive device (IPD).

19. The integrated circuit of claim 18, wherein the fundamental frequency matching circuit comprises the at least one second capacitor and at least one second inductor connected in series along the parallel branch;

wherein the one or more reactive components of the fundamental frequency matching circuit comprise the at least one second capacitor; and wherein the at least one second capacitor comprises a second top metal and a second bottom metal with a dielectric layer therebetween on an upper surface of the silicon carbide (SiC) substrate of the integrated passive device (IPD).

20. The integrated circuit of claim 19, wherein the higher order harmonic termination circuit comprises a parallel LC resonator connected in series between the at least one second inductor and the at least one second capacitor, the parallel LC resonator comprising the at least one second capacitor connected in parallel with at least one first inductor; and wherein the one or more reactive components of the higher order harmonic termination circuit comprise the at least one first capacitor and the at least one first inductor.

21. The integrated circuit of claim 19, wherein the integrated passive device (IPD) is configured to form the at least one first inductor with a metallization arranged on a surface of the silicon carbide (SiC) substrate.

22. The integrated circuit of claim 15, wherein the integrated passive device (IPD) comprises:

a first top metal; and a first bottom metal, wherein the integrated passive device (IPD) is configured to form at least one first capacitor with the first top metal and the first bottom metal having a dielectric layer therebetween.

23. The integrated circuit of claim 15, wherein the integrated passive device (IPD) comprises:

a second top metal; and a second bottom metal, wherein the integrated passive device (IPD) is configured to form at least one second capacitor with the second top metal and the second bottom metal having a dielectric layer therebetween.

24. The integrated circuit according to claim 23 wherein the integrated passive device (IPD) comprises:

a bottom metallization on a bottom of the silicon carbide (SiC) substrate; and at least one via electrically connected to the bottom metallization and the second bottom metal.

25. The integrated circuit of claim 15, wherein the integrated passive device (IPD) comprises:

a first top metal;

a first bottom metal;

a second top metal; and a second bottom metal, wherein the integrated passive device (IPD) is configured to form at least one first capacitor with the first top metal and the first bottom metal having a dielectric layer therebetween; and wherein the integrated passive device (IPD) is configured to form at least one second capacitor with the second top metal and the second bottom metal having a dielectric layer therebetween.

26. The integrated circuit of claim 15, wherein the integrated passive device (IPD) additionally comprises one or more reactive components of an impedance matching network on an upper surface of the silicon carbide (SiC) substrate of the integrated passive device (IPD).

* * * * *